US010535497B2

(12) United States Patent
Tamaki et al.

(10) Patent No.: US 10,535,497 B2
(45) Date of Patent: Jan. 14, 2020

(54) ELECTRON MICROSCOPE AND IMAGING METHOD

(71) Applicant: HITACHI HIGH-TECHNOLOGIES CORPORATION, Minato-ku, Tokyo (JP)

(72) Inventors: Hirokazu Tamaki, Tokyo (JP); Ken Harada, Tokyo (JP); Keiji Tamura, Tokyo (JP); Yoshifumi Taniguchi, Tokyo (JP); Hiroto Kasai, Tokyo (JP); Toshie Yaguchi, Tokyo (JP); Takafumi Yotsuji, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 16/089,292

(22) PCT Filed: Aug. 22, 2016

(86) PCT No.: PCT/JP2016/074355
§ 371 (c)(1),
(2) Date: Sep. 27, 2018

(87) PCT Pub. No.: WO2018/037444
PCT Pub. Date: Mar. 1, 2018

(65) Prior Publication Data
US 2019/0131107 A1    May 2, 2019

(51) Int. Cl.
*H01J 37/26* (2006.01)
*H01J 37/295* (2006.01)
*H01J 37/22* (2006.01)

(52) U.S. Cl.
CPC .......... *H01J 37/263* (2013.01); *H01J 37/226* (2013.01); *H01J 37/295* (2013.01)

(58) Field of Classification Search
USPC ........................................................ 250/311
See application file for complete search history.

(56) References Cited

U.S. PATENT DOCUMENTS 6,570,156 B1 * 5/2003 Tsuneta .................. H01J 37/26
                                                              250/311
8,835,846 B2    9/2014 Buijsse et al.
(Continued)

FOREIGN PATENT DOCUMENTS

JP    2003-217498 A    7/2003
JP    2007-250541 A    9/2007
(Continued)

OTHER PUBLICATIONS

Settles, G.S.; Schlieren and Shadowgraph Techniques; Chapter 2, Springer, 2001, pp. 26-37.
(Continued)

*Primary Examiner* — Kiet T Nguyen
(74) *Attorney, Agent, or Firm* — Miles & Stockbridge, P.C.

(57) ABSTRACT

An electron microscope for observation by illuminating an electron beam on a specimen, includes: an edge element disposed in a diffraction plane where a direct beam not diffracted by but transmitted through the specimen converges or a plane equivalent to the diffraction plane; and a control unit for controlling the electron beam or the edge element. The edge element includes a blocking portion for blocking the electron beam, and an aperture for allowing the passage of the electron beam. The aperture is defined by an edge of the blocking portion in a manner that the edge surrounds a convergence point of the direct beam in the diffraction plane. The control unit varies contrast of an observation image by shifting, relative to the edge, the convergence point of the direct beam along the edge while (Continued)

maintaining a predetermined distance between the convergence point of the direct beam and the edge.

14 Claims, 19 Drawing Sheets

(56) References Cited

U.S. PATENT DOCUMENTS

| | | |
|---|---|---|
| 2003/0132383 A1 | 7/2003 | Benner |
| 2007/0284528 A1 | 12/2007 | Benner et al. |
| 2009/0166558 A1 | 7/2009 | Nagayama |
| 2010/0181481 A1 | 7/2010 | Benner et al. |
| 2011/0233403 A1* | 9/2011 | Own .................. H01J 37/153 |
| | | 250/311 |
| 2012/0049062 A1 | 3/2012 | Benner et al. |

FOREIGN PATENT DOCUMENTS

| | | |
|---|---|---|
| JP | 2014-049444 A | 3/2014 |
| WO | 2007058182 A1 | 5/2007 |

OTHER PUBLICATIONS

Nagayama, Kuniaki; Complex Observation in Electron Microscopy: V. Phase Retrieval for Strong Objects with Foucault Knife-Edge Scanning; Journal of the Physical Society of Japan; vol. 73; No. 10; Oct. 15, 2004; pp. 2725-2731.

International Search Report dated Sep. 20, 2016, in International Application No. PCT/JP2016/074355.

\* cited by examiner

ELECTRON MICROSCOPE AND IMAGING METHOD

TECHNICAL FIELD

The present invention relates to an electron microscope and imaging method.

BACKGROUND ART

A transmission electron microscope (hereinafter, referred to as "TEM") is a device which applies an electron beam accelerated by a high voltage to an observation object material and focuses the electron beam transmitted through the material into an enlarged image by means of an electromagnetic lens for microstructure imaging. In a state where an imaging lens is focused on the observation object material (specimen), amplitude information on a field formed principally by electrons transmitted through the specimen is observed as image contrast. It is difficult to obtain an image having sufficient contrast from a specimen, such as biological specimen and organic material, that exhibits a small amplitude change. A method which secures a good image contrast by blocking a part of diffracted wave with a knife edge is known as one of methods for obtaining an image of good contrast from such a specimen exhibiting small amplitude change (Patent Literature 1).

CITATION LIST

Patent Literature

Patent Literature 1: Japanese Unexamined Patent Application Publication No. 2014-049444

Nonpatent Literature

Nonpatent Literature 1: G. S. Settles; "Schlieren and Shadowgraph Techniques" Chapter 2; Springer, 2001

SUMMARY OF INVENTION

Technical Problem

According to the method, as set forth in Patent Literature 1, where the knife edge is used for blocking a part of the diffracted wave so as to obtain the good image contrast, the edge is unidirectionally arranged with respect to a direct beam so that the contrast produced by blocking the diffracted wave is inevitably unidirectional. This results in an anisotropic image contrast which interferes with image interpretation.

It is an object of the invention to provide an electron microscope and an imaging method for acquiring an observation image having an isotropic image contrast.

Solution to Problem

The outline of a typical aspect of the invention is briefly described as follows.

An electron microscope for observation by applying an electron beam to a specimen includes: an edge element disposed in a diffraction plane where a direct beam not diffracted by but transmitted through the specimen converges, or a plane equivalent to the diffraction plane; and a control unit for controlling the electron beam or the edge element. The edge element includes: a blocking portion for blocking the electron beam; and an aperture for allowing the passage of the electron beam. The aperture is defined by an edge of the blocking portion in a manner that the edge surrounds a convergence point of the direct beam in the diffraction plane. The control unit varies contrast of an observation image by shifting, relative to the edge, the convergence point of the direct beam along the edge while maintaining a predetermined distance between the convergence point of the direct beam and the edge.

Advantageous Effects of Invention

The invention provides the acquisition of the observation image having the isotropic image contrast.

DESCRIPTION OF EMBODIMENTS

Figure 1:
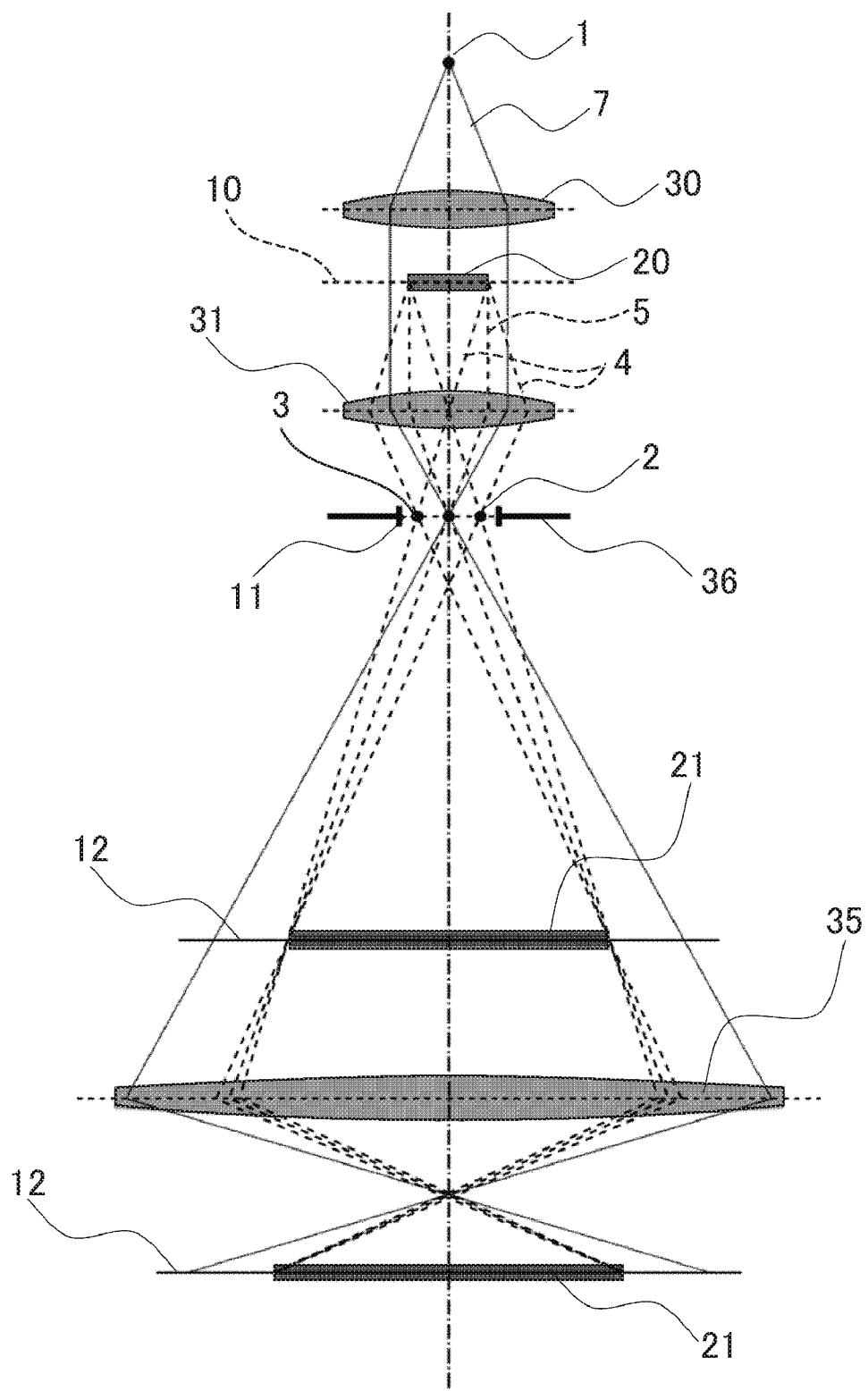
FIG. 1 is a diagram schematically showing an optical system of TEM performing image observation.

A comparative example and an example of the invention will hereinbelow be described with reference to the accompanying drawings. In the following description, however, equal or similar reference numerals are assigned to equal or similar components, which are explained only once in most cases to avoid repetitions.

First, TEM is described with reference to FIG. 1. FIG. 1 is a diagram schematically showing an optical system of TEM performing image observation. An electron beam 7 spread from a virtual source 1 formed at place above an observation specimen 20 is transmitted through an illumination system lens 30 and thereafter, illuminated on the observation specimen 20 placed on a specimen plane 10. The electron beam 7 transmitted through the observation specimen 20 is separated into a diffracted wave 4 diffracted by the observation specimen 20 and a direct beam 5 not diffracted by but transmitted through the specimen. The both waves spread from place above the specimen 20 at different angles. Therefore, the waves converge in diffraction spots 2, 3 at different points on a back focal plane 11 of an objective lens 31 rearward of the specimen 20 according to the angles and directions thereof, thus forming a diffraction plane. A diffraction spot 3 is conjugate to the diffraction spot 2. The diffracted wave 4 converged in the diffraction spots 2, 3 spread again to interfere with the direct beam on an image plane 12. As a result, an observation image 21 is formed. The observation image 21 is image-focused again and projected by an imaging system lens 35 disposed thereunder so as to be observed. In such a bright field imaging with the imaging lens focused on the observation specimen 20, the amplitude information on the field formed by the electron transmitted through the observation specimen 20 is observed as the image contrast.

A scattering contrast is also known as a different type of contrast. That is, the observation is performed in a state where a part of diffracted wave components is blocked by means of an objective aperture 36 disposed on the diffraction plane 11 in FIG. 1. In this case, a portion intensely scattering the electron beam 7, such as composed of a relatively heavy element such as metal, is imaged as a black contrast portion.

Regarding the image contrast thus obtained, any image of an observation specimen having a strong interaction with the electron beam 7 can achieve sufficient contrast. However, it is difficult to obtain an image having sufficient contrast from an observation specimen having weak interaction with the electron beam, such as biological specimen and organic material.

A method (comparative example) where the knife edge is used for achieving good image contrast is described with reference to FIG. 2. This method is studied by the present inventors with an aim to obtain an image of good contrast from an observation specimen having a weak interaction with the electron beam. This method utilizes a phenomenon that a wave slightly deflected as transmitted through the specimen is separated on the diffraction plane rearward of a lens.

Figure 2:
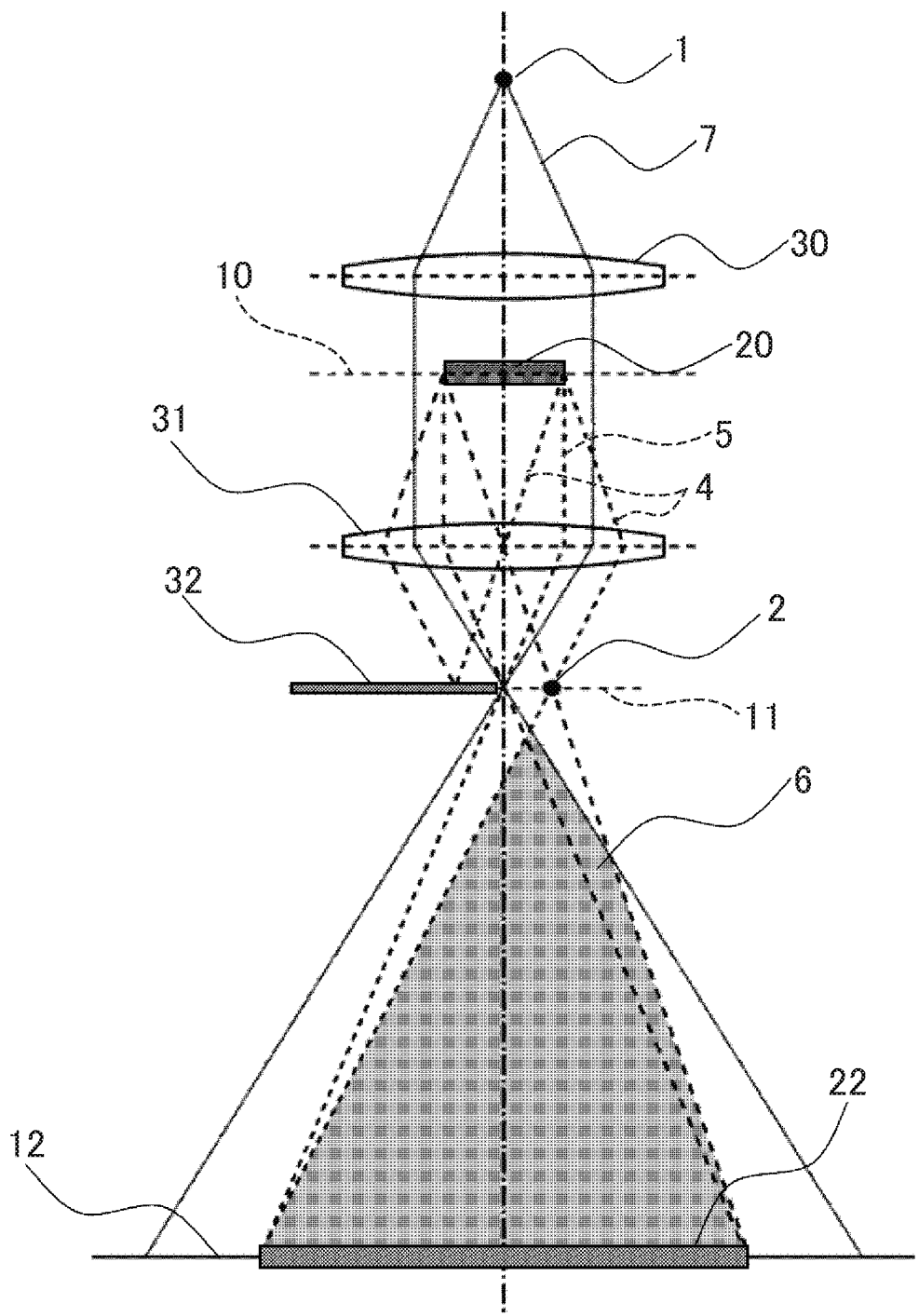
FIG. 2 is a diagram schematically showing an observation optical system of TEM according to a comparative example.

FIG. 2 is a diagram schematically showing an observation optical system of TEM according to the comparative example. FIG. 2 omits the imaging system lens 35 to enhance the clarity of the drawing. The electron beam 7 spread from the virtual source 1 formed at place above the observation specimen 20 is suitably adjusted by the illumination system lens 30 and thereafter, illuminated on the observation specimen 20. The electron beam 7 transmitted through the observation specimen 20 is separated into the diffracted wave 4 diffracted according to a local configuration of the observation specimen 20 and the direct beam 5 not diffracted by but transmitted through the specimen. At this time, the wave diffracted from the observation specimen 20 is known to basically exhibit a point symmetrical distribution, or a conjugate distribution with the direct beam 5 at the center. While the diffracted wave 4 converges in the diffraction spot 2 on the diffraction plane 11, a knife edge 32 is disposed on the diffraction plane 11 in a manner to cover a half of the surface thereof, thus blocking a half of the diffracted wave 4. Therefore, only the conjugate diffracted wave 4 on one side is lost so that only the components of the diffracted wave 4 through the diffraction spot 2 on the other side contribute to image formation. As a result, an enhanced contrast appears in an observation image 22 in correspondence to a portion where the electron beam 7 is particularly intensively deflected, such as an edge portion of the observation specimen 20. The knife edge 32 is in a rectangular shape as seen in plan view. A shaded region indicated at 6 is an interference region between the direct beam and the diffracted wave. According to the comparative example, phase-derived image information intrinsically lost by interference can be acquired as the enhanced contrast. Hence, an image with unidirectionally enhanced contrast can be acquired.

However, according to the comparative example as described above, the edge is unidirectionally arranged with respect to the direct beam so that the contrast produced by blocking the diffracted wave is inevitably unidirectional. This results in an anisotropic image contrast. In this connection, an embodiment for obtaining an observation image having the isotropic image contrast is described as below.

Figure 3A:
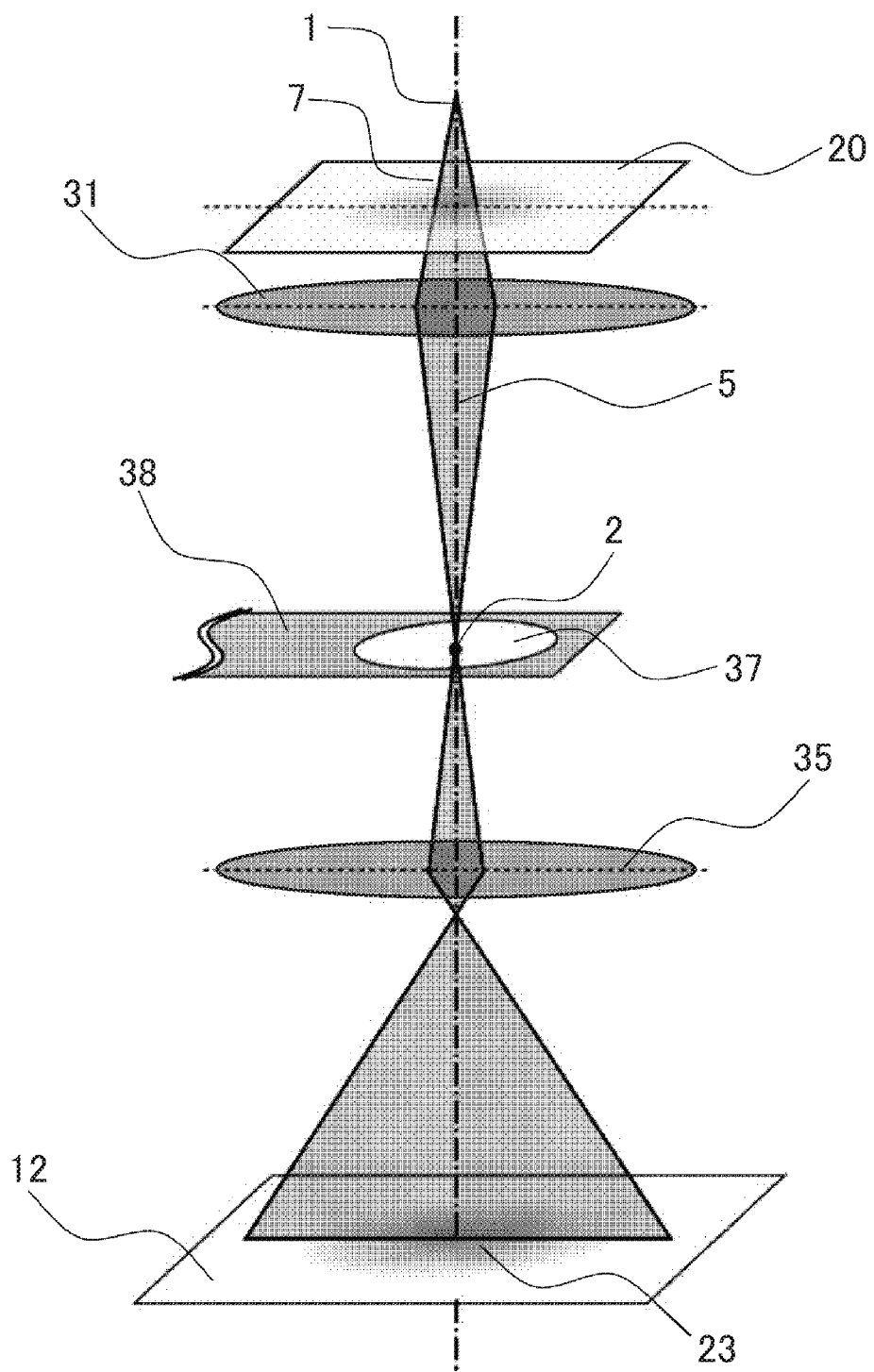
FIG. 3A is a diagram showing an instrument configuration of TEM according to an embodiment hereof.

FIG. 3A is a diagram showing an instrument configuration of TEM according to an embodiment hereof. The electron beam 7 spread from the virtual source 1 formed above the observation specimen 20 is illuminated on the observation specimen 20. The electron beam 7 transmitted through the observation specimen 20 is converged by the objective lens 31 to form the diffraction spot 2 on the diffraction plane.

Subsequently, the electron beam 7 is focused by the imaging system lens 35 disposed further below, forming an observation image 23 on the image plane 12. Disposed on the diffraction plane is an edge element 38 including an aperture 37. Unlike a phase plate of Patent Literature 1, the edge element 38 is formed of a blocking member non-transparent to the electron beam 7. The aperture 37 is a large aperture in contrast to a very small aperture formed in the phase plate of Patent Literature 1. In a case where the diffraction spot 2 passes by the center of the aperture, an obtained image is a common bright field image.

Figure 3B:
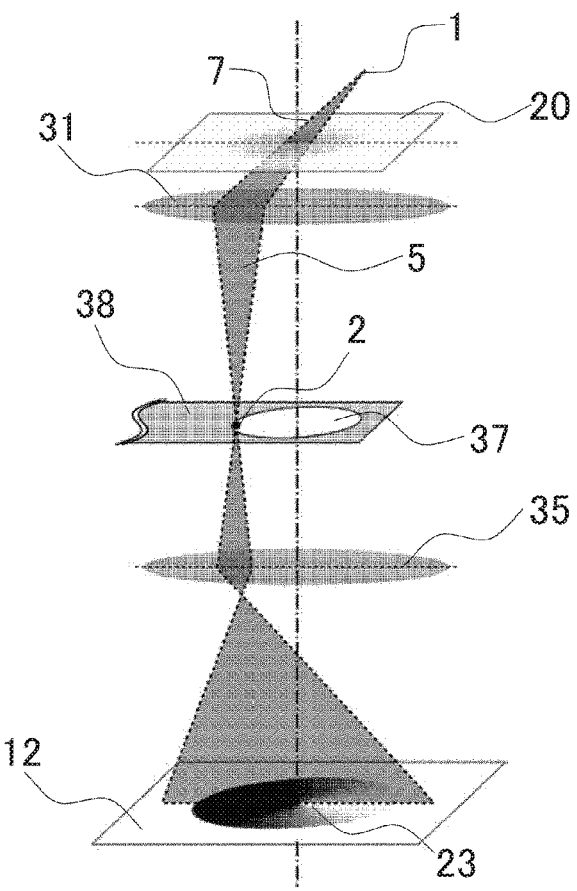
FIG. 3B is a diagram illustrating an optical condition for obtaining enhanced contrast using TEM of FIG. 3A.

FIG. 3B is a diagram showing a condition for obtaining the enhanced contrast using the TEM of FIG. 3A. In this example, the diffraction spot 2 on the diffraction plane is shifted closer to a part of the edge constituting the aperture 37 by inclining the electron beam 7 illuminated on the observation specimen 20. Regarding a region in intimate proximity to the diffraction spot 2 in this case, the part of the edge constituting the aperture 37 blocks about a half of the diffraction plane, functioning nearly as the knife edge. In other words, the aperture 37 allows the passage of about a half of the diffraction plane. In this case, one of the conjugate diffracted waves does not contribute to image formation so that the enhanced contrast appears in the observation image 23.

Incidentally, the edge defining the aperture 37 is located around the diffraction spot. Like a recess formed in a linear edge of Patent Literature 1, a member an edge of which is not located around the diffraction spot and a half or more of which accounts for a region that does not surround the diffraction spot is not included in the aperture 37 formed in the edge element 38.

Figure 4A:
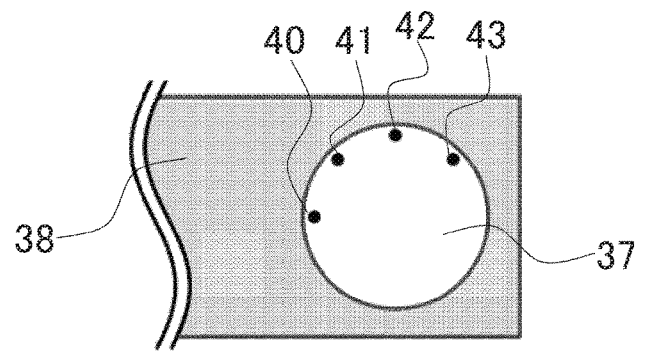
FIG. 4A is a plan view showing positions taken by a diffraction spot on an edge element shown in FIG. 3B.
Figure 4B:
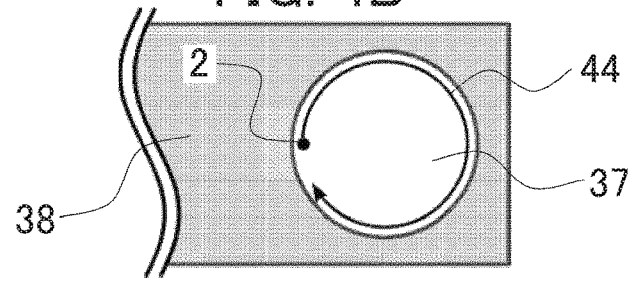
FIG. 4B is a plan view schematically showing a trajectory of the diffraction spot being shifted.
Figure 4C:
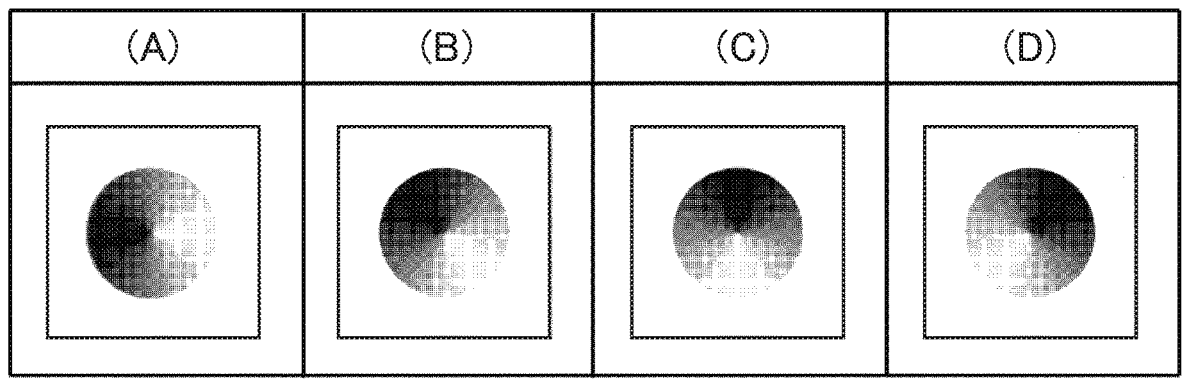
FIG. 4C shows observation images corresponding to the respective positions of the diffraction spot shown in FIG. 4A.

Next, the enhanced contrast is described with reference to FIG. 4A to FIG. 4C. FIG. 4A is a plan view showing a positional relation of diffraction spots on the diffraction plane formed in the same plane as the edge element shown in FIG. 3B. FIG. 4B is a plan view showing a trajectory of the diffraction spot continuously shifted on the edge element. FIG. 4C shows observation images corresponding to the respective positions of the diffraction spot shown in FIG. 4A. In a case where the diffraction spot 2 is located at a position indicated at 40, for example, about a half of the diffraction plane is blocked by the edge. Hence, an enhanced contrast appears in an image as an anisotropic contrast in a direction according to the direction of the edge, as shown in FIG. 4C(A), where the left side of the image is dark while the right side thereof is bright. Similarly, in a case where the diffraction spot 2 is located at a position indicated at 41, an anisotropic contrast appears in an image, as shown in FIG. 4C(B), where the upper left side is dark while the lower right side is bright. In a case where the diffraction spot 2 is located at a position indicated at 42, an anisotropic contrast appears in an image, as shown in FIG. 4C(C), where the upper side is dark while the lower side is bright. In a case where the diffraction spot 2 is located at a position indicated at 43, an anisotropic contrast appears in an image, as shown in FIG. 4C(D), where the upper right side is dark while the lower left side is bright. This indicates that there is a correspondence relation between the direction of blocking the electron beam 7 near the diffraction spot 2 and the direction of the enhanced contrast appearing in the image. Needless to say, a different angular relation from the relation between the position of the diffraction spot and the contrast of the image according to the embodiment can be established in a real instrument because an additional rotation offset affects the relation between the spot position on the aperture and the direction of contrast appearing on the image as a result of rotational action applied to the electron orbit by a magnetic lens. In a case where the diffraction spot 2 is shifted along a trajectory 44 as shown in FIG. 4B in a state where a constant distance is maintained between the diffraction spot 2 and the aperture 37, there occurs an effect optically equivalent to an event that only the direction of blocking the diffracted wave is continuously changed. In a case where the diffraction spot 2 continues cyclic movement along the trajectory 44, the direction of enhanced contrast appearing in the observation image changes continuously and cyclically. Therefore, an observer can acquire the enhanced contrast for a structure present in the observation specimen 20 as seen from various directions. Accordingly, the observer can obtain an isotropic image contrast by integrating images with contrast enhanced in various directions.

Figure 5A:
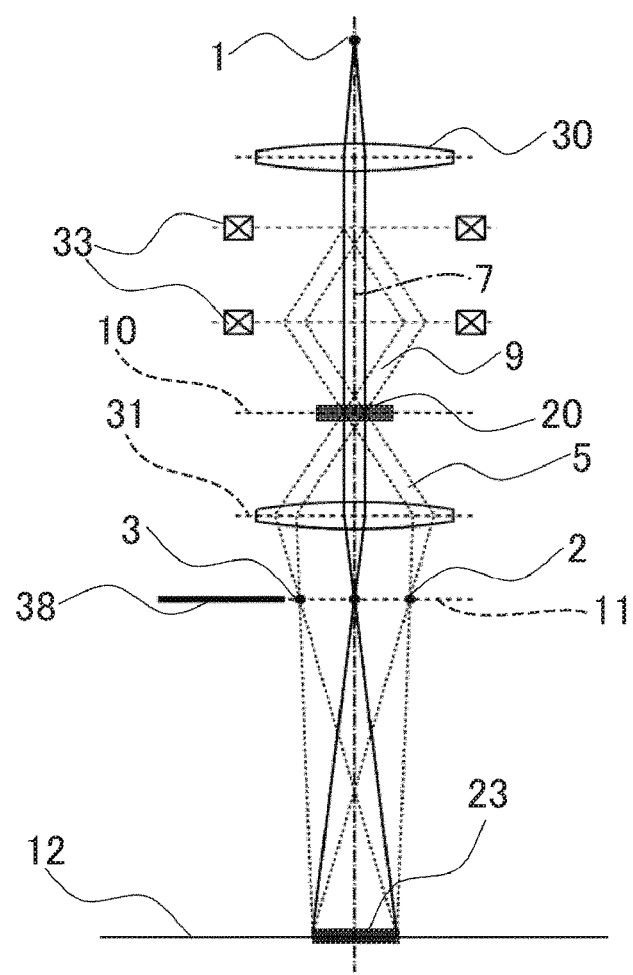
FIG. 5A is a diagram illustrating an example of a method for shifting the diffraction spot on the diffraction plane.

Next, a first method of changing the position of the diffraction spot on the diffraction plane is described with reference to FIG. 5A. FIG. 5A is a diagram illustrating an example of a method for shifting the diffraction spot on the diffraction plane. FIG. 5A omits the imaging system lens 35 to enhance the clarity of the drawing. In this example, upper and lower deflectors 33 disposed above the observation specimen 20 are used in combination such as to incline the electron beam 7 whereby only an illumination angle of the electron beam 7 is changed without changing an illumination point thereof on the observation specimen 20. Indicated at 9 is an exemplary trajectory of the inclinedly illuminated electron beam 7. In a case where only the illumination angle of the electron beam 7 is changed, the electron beam 7 forms the diffraction spot 3 in the same diffraction plane 11 as that before the electron beam 7 is inclined. The diffraction spot shifts in the diffraction plane 11 according to the angle and direction of the inclination of the electron beam. The same applies to the electron beam diffracted from the observation specimen 20. Accordingly, the whole diffraction plane 11 maintaining the same intensity distribution is translated by the inclination of the illuminating electron beam 7. This permits the positional relation between the diffraction spot 3 and the edge element 38 to be adjusted without moving the edge element 38.

Needless to say, the inclining of the illuminating electron beam 7 is not limited to the arrangement of the deflectors 33 as shown in the figure but can also be accomplished by using any optional deflectors above the observation specimen 20 in combination or using a single (one stage) deflector disposed on a suitable plane.

Figure 5B:
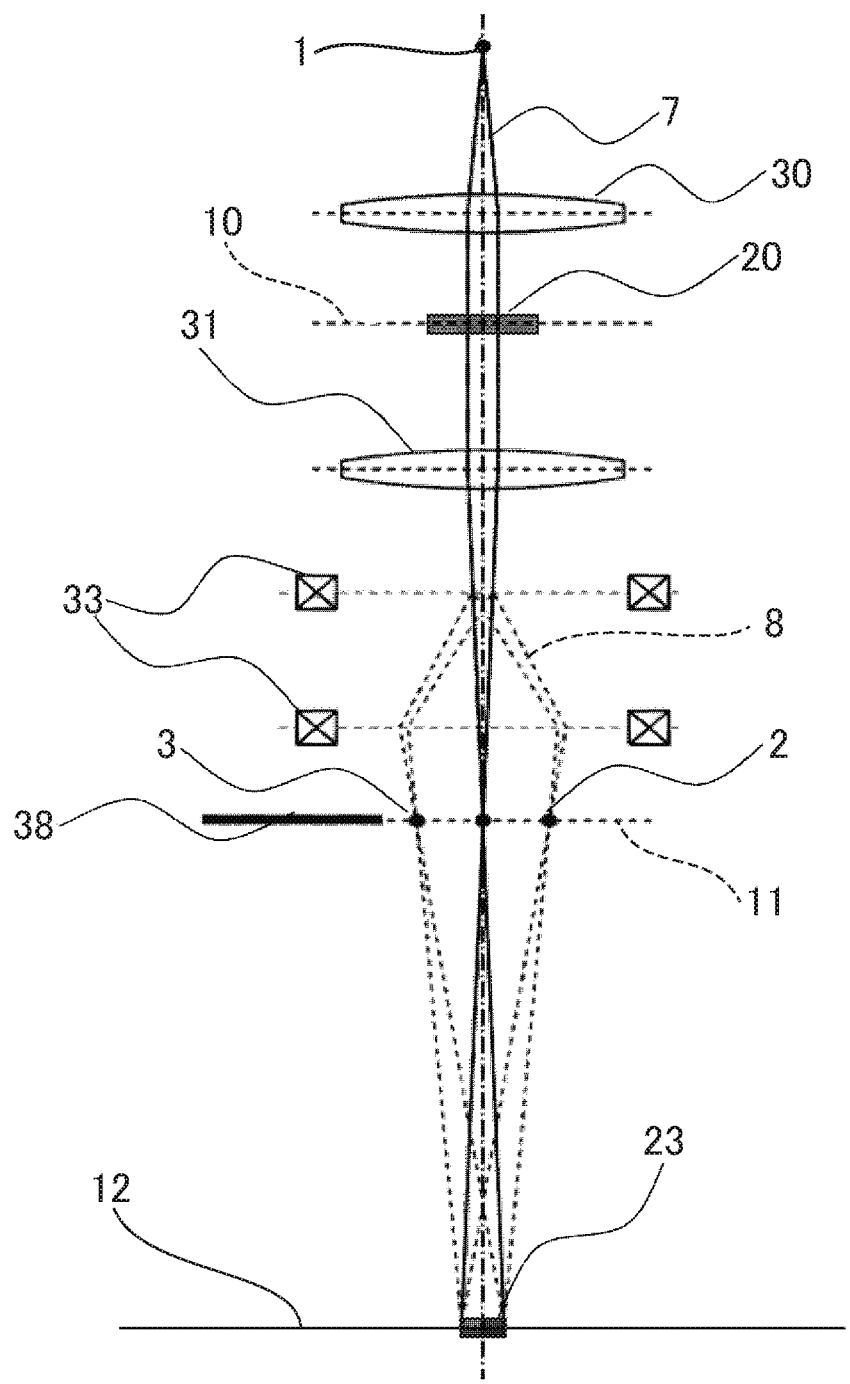
FIG. 5B is a diagram illustrating another example of the method for shifting the diffraction spot on the diffraction plane.

Next, a second method of changing the position of the diffraction spot on the diffraction plane is described with reference to FIG. 5B. FIG. 5B is a diagram illustrating another example of the method for shifting the diffraction spot on the diffraction plane. FIG. 5B omits the imaging system lens 35 to enhance the clarity of the drawing. The example illustrates how the deflectors 33 disposed under the observation specimen 20 are used. In this case, as well, the use of two stages of deflectors 33 permits the diffraction spots 2, 3 to be shifted on the diffraction plane 11 without moving the observation image 23. Besides the arrangement shown in FIG. 5B, an arrangement employing a single deflector alone is also adapted for control of the diffraction spots 2, 3.

Fast, high-accuracy and highly reproducible beam control can be achieved by using the deflector for such an adjustment of positional relation between the diffraction spots 2, 3 and the edge element 38.

Besides the deflectors of FIG. 5A and FIG. 5B, a combination of plural coils disposed on an optical system of the electron microscope is also usable for controlling the diffraction spot. Instead of moving the virtual source as a point source, the light source may be arranged in an annular configuration as an annular illumination.

As a method for controlling the direction of the edge blocking the diffracted wave with respect to the diffraction spot or for controlling the quantity of blocked diffracted wave, the electromagnetic lens disposed at place optically higher than the edge element 38 is also usable. In the case of use of a lens using the magnetic field, the electron orbit is subjected to the rotational action caused by lens action, enabling the change of the blocking direction. Particularly, in a case where a plurality of lenses are used in combination, it is possible to control the rotation or magnification of the diffraction plane 11 independently. This provides an advantage in controlling the positional relation of the edge with respect to the diffraction spot.

Figure 6:
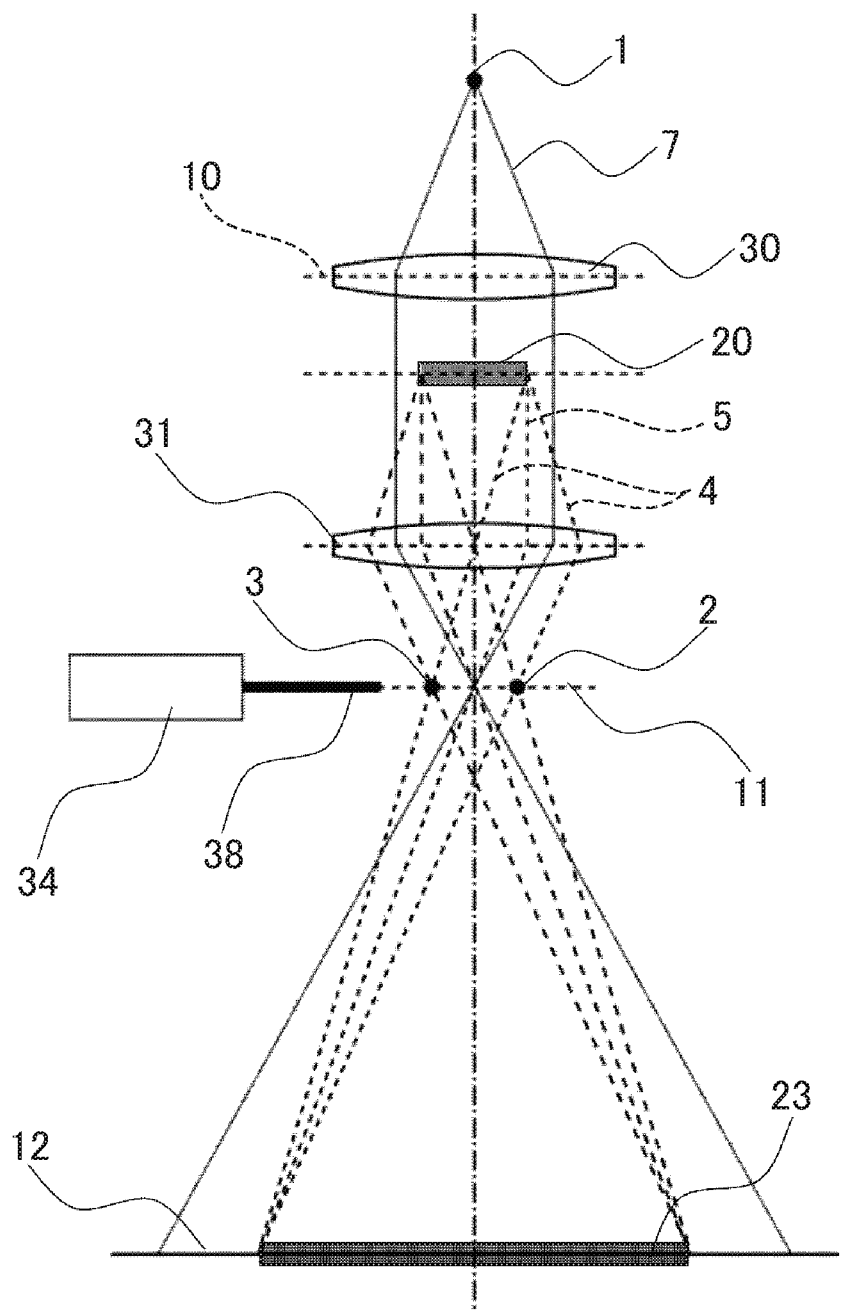
FIG. 6 is a diagram illustrating an example where a positional relation between the edge and the diffraction spot is changed by moving the edge element.

Next, an example of changing the positional relation between the edge and the diffraction spot by moving the edge element 38 is described with reference to FIG. 6. FIG. 6 is a diagram illustrating an example of changing a positional relation between the edge and the diffraction spot by moving the edge element. FIG. 6 omits the imaging system lens 35 to enhance the clarity of the drawing. The TEM of FIG. 6 includes a micromotion mechanism 34 for mechanically controlling the position of the edge element 38. The same effect as that obtained by the above examples of changing the positions of diffraction spot 2, 3 as shown in FIG. 5A and FIG. 5B can be obtained by moving the edge element 38 in such a manner as to maintain a constant distance between the edge and the diffraction spots while keeping the diffraction spots 2, 3 fixed in given positions. Even though the edge element 38 does not move continuously but moves irregularly, if the distance between the diffraction spot 2 and the edge follows a given distribution in terms of average over a given time period, the observed image can obtain the enhanced contrast in various direction.

Figure 8:
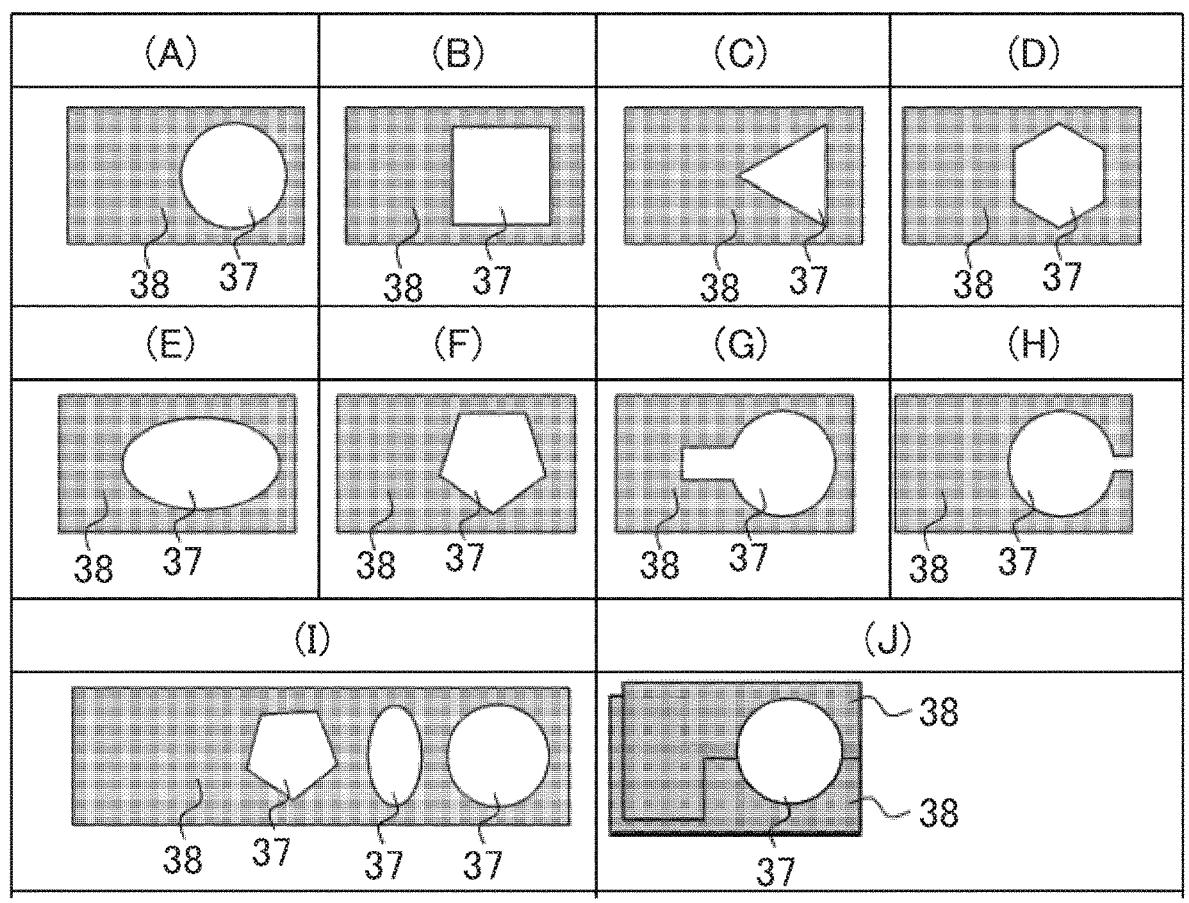
FIG. 8 is a set of plan views showing exemplary configurations of an aperture formed in the edge element.

Next, a configuration of the aperture 37 formed in the edge element 38 is described with reference to FIG. 8. FIG. 8 is a set of plan views showing exemplary configurations of the aperture formed in the edge element. It is preferred that the configuration of the aperture 37 is basically circle (FIG. 8(A)). However, the effect of the embodiment is obtainable by adopting an aperture having a polygonal configuration such as triangular configuration (FIG. 8(C)), square configuration (FIG. 8(B)), pentagonal configuration (FIG. 8(F)), hexagonal configuration (FIG. 8(D)), an elliptical configuration (FIG. 8(E)), or a combination of any of the above such as a configuration of FIG. 8(G). As shown in FIG. 8(H), the aperture 37 need not be formed in a closed configuration in the surface of the edge element 38. Further, as shown in FIG. 8(J), the aperture can take a shape defined by combining a plurality of edge elements 38. An open portion of the aperture of FIG. 8(H) where the edge is not continuous (closed) may preferably be a slit or the like which has very narrow width relative to the aperture 37. Alternatively, a single edge element 30 may be formed with a plurality of apertures 37 as shown in FIG. 8(I). In this case, the imaging is performed using any one of the plural apertures 37 by moving the edge element 38.

Although it is desirable that the edge element 38 is mounted in a manner that a plane including the aperture 37 is perpendicular to the optical axis, the embodiment can be implemented in such a state where the edge element 38 does not satisfy such a condition. In such a case, it is also effective to use a method where the trajectory described by the moving diffraction spot is varied to conform to a configuration of the aperture as seen along the optical axis. In a case where the edge element 38 formed with the circular aperture 37 is mounted in an inclined position from the vertical line with respect to the optical axis, for example, the circular aperture as seen along the optical axis acts as an elliptical aperture. In this case, the diffraction spot is so conditioned as to describe an elliptical trajectory. By doing so, the direction of blocking the diffracted wave can be changed while maintaining the constant distance between the diffraction spot and the edge.

According to the above-described imaging method, the direction in which the enhanced contrast appears can be controlled by changing the direction of blocking the diffraction spot. The images thus obtained under a variety of conditions can be interpreted from a viewpoint unrestricted by anisotropy by observing how these images vary. Furthermore, an image easier to interpret or an image having quantitative information can be obtained by performing arithmetic processing such as integration, addition, subtraction, multiplication, division, derivation, integral treatment, convolution, based on the images obtained under different conditions.

Figure 7:
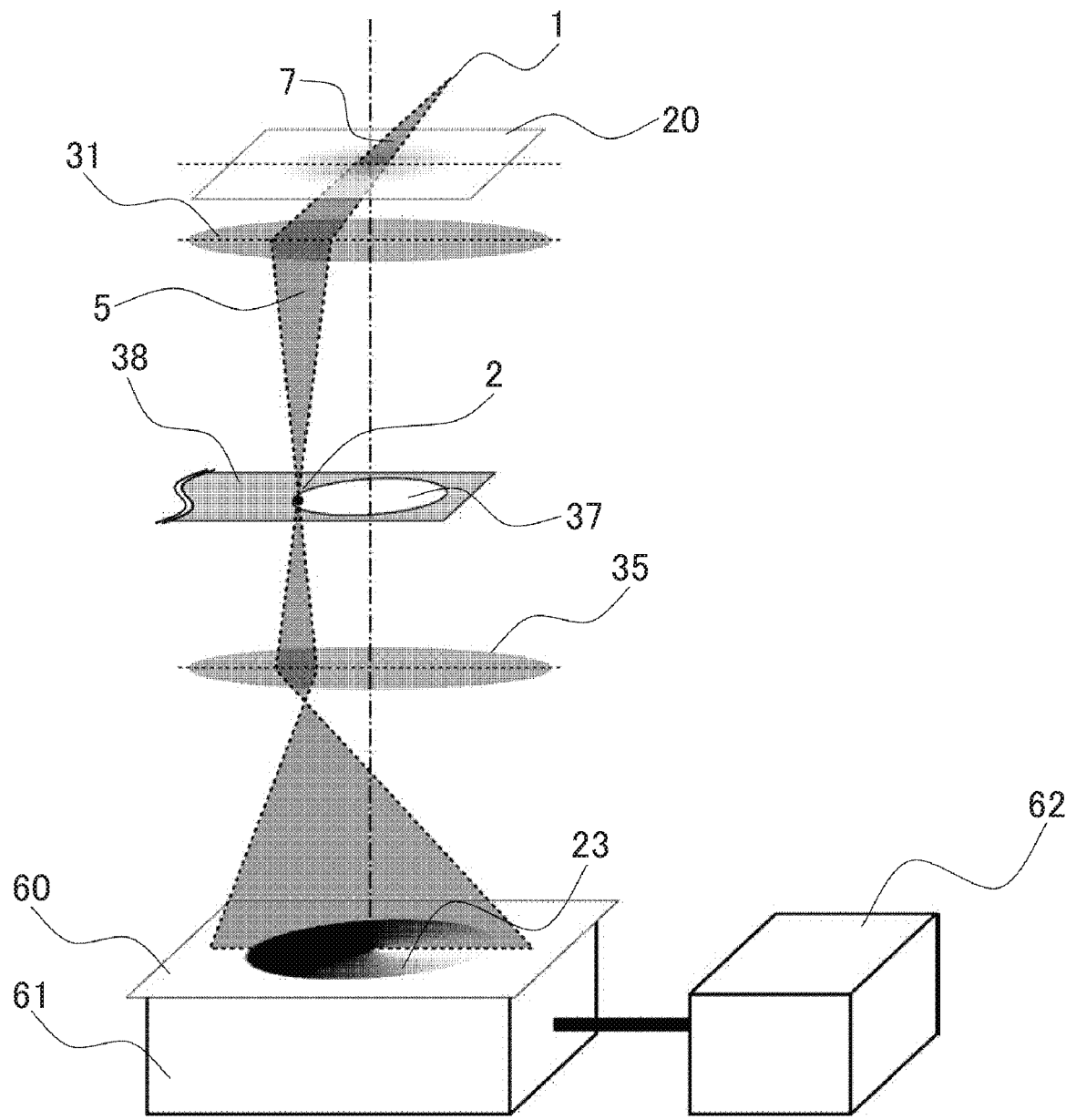
FIG. 7 is a diagram showing an exemplary configuration made by adding required components for handling the observation image to the configuration shown in FIG. 3B.

Next, processing of the observation image is described with reference to FIG. 7. FIG. 7 is a diagram showing an exemplary configuration made by adding required components for handling the observation image to the configuration shown in FIG. 3B. The observation image 23 is formed on a fluorescent plate 60 and observed. Opposed to the fluorescent plate 60 is an imaging device 61 for recording a projected image. The recorded image is taken into an arithmetic unit 62 to be displayed or processed.

In a case where the condition of blocking the diffraction spot 2 is changed at a speed perceivable by human sense or changed in a faster cycle than response speed of luminous phenomenon of the fluorescent plate 60, an image substantially equivalent to an integration of the observation images 23 obtained under different conditions is projected on the fluorescent plate 60. Thus, an image having an isotropic image contrast can be obtained.

While the imaging device 61 records inputted signals during a certain imaging time as one image, an image substantially equivalent to the integration of the observation images 23 captured under different conditions can be recorded by setting this imaging time longer than a cycle of changing the blocking condition for the diffraction spot. There is no limitation on the number of cyclic changes of the diffraction spot during one imaging time, the cycle number is preferably an almost integer. A preferred cycle number is in the range of one to one hundred from the viewpoint of frequency of image update and operability.

There may be provided a control that does not limit the movement of the diffraction spot to a continuous circular movement (e.g., to control the diffraction spot movement on a per 120°-segment basis for image acquisition, or to shift the diffraction spot randomly on the circumference of a circle so as to averagely distribute the spot on the circumference of circle). Even in a case where the imaging time is shorter than the changing cycle of blocking condition because the imaging is interrupted at every third part or every half of one changing cycle or one changing cycle's worth of images are acquired by repeating a step of taking one image in one changing cycle multiple times, an image substantially equivalent to one acquired by performing the imaging operation for an even longer imaging time can be obtained by addition of plural recorded images.

Figure 9A:
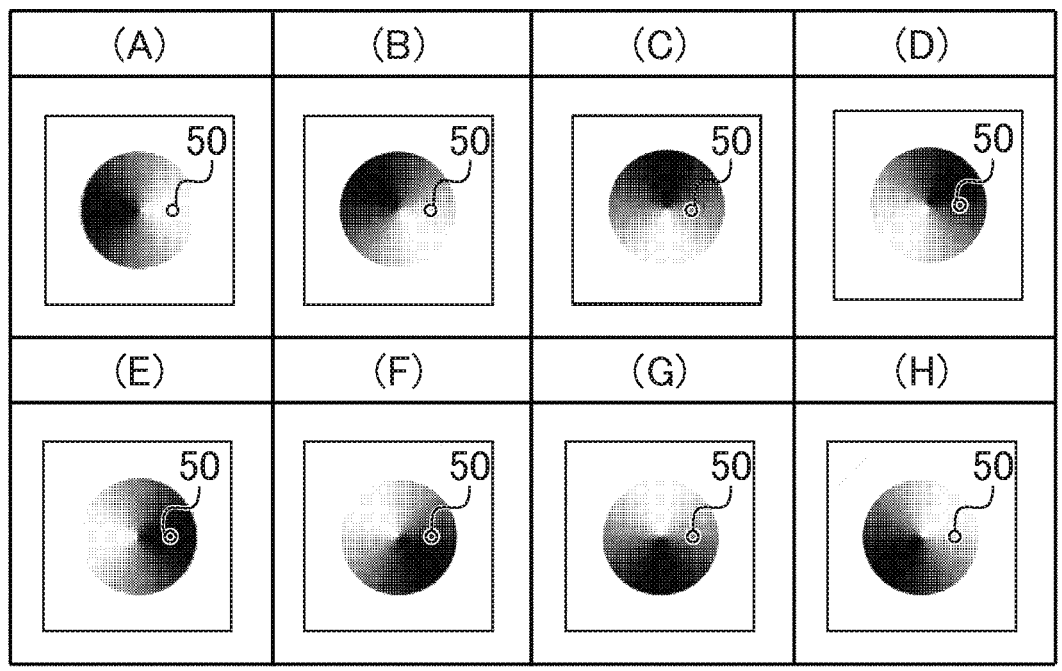
FIG. 9A is a set of images individually showing observation images obtained on different conditions of the edge orientation with respect to the diffraction spot.
Figure 9B:
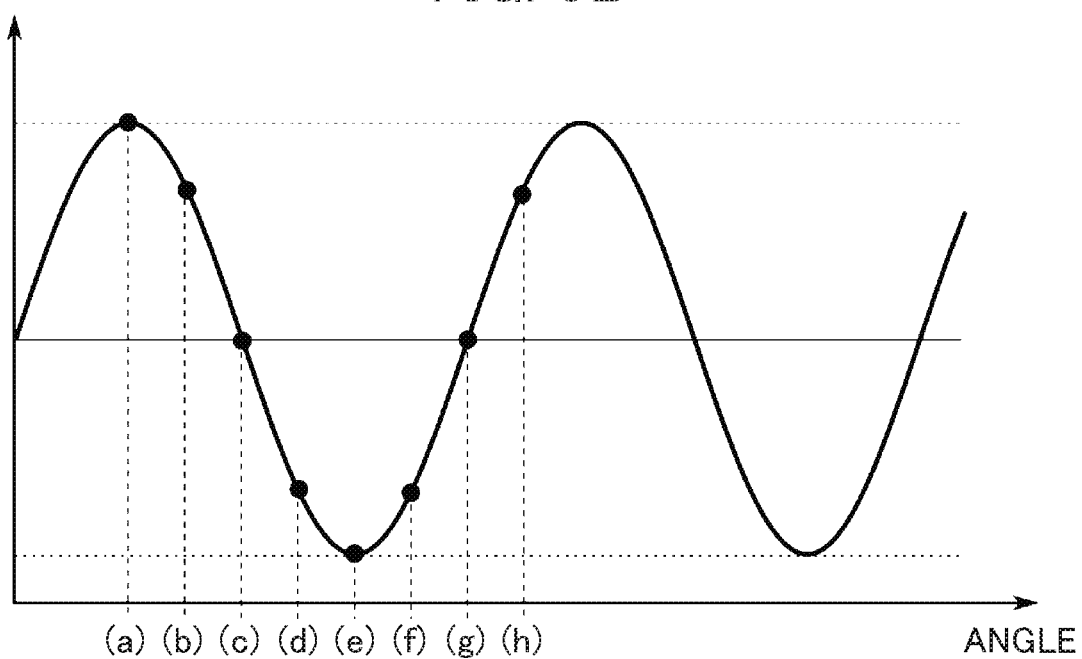
FIG. 9B is a graph showing contrast variations at particular spots in the observation image.
Figure 9C:
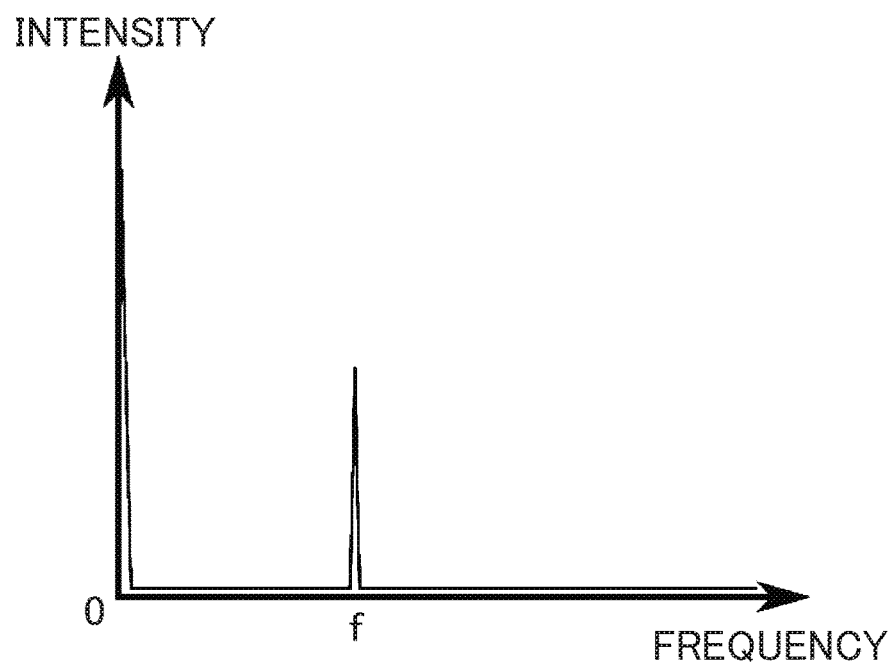
FIG. 9C is a graph showing an example where the contrast variation of FIG. 9B is Fourier transformed to the orientation angle of the edge with respect to the diffraction spot.

Next, contrast of the observation image is described with reference to FIG. 9A to FIG. 9C. FIG. 9A is a set of images individually showing observation images obtained on different conditions of the edge angle with respect to the diffraction spot. FIG. 9B is a graph showing contrast changes at a particular region in the observation image. FIG. 9C is a graph showing an example where the contrast variation of FIG. 9B is Fourier transformed to the orientation angle of the edge with respect to the diffraction spot. In a case where the diffraction spot is shifted along the edge of the aperture to be returned to the original position in one cycle, for example, the direction of the enhanced contrast appearing on the observation image also changes in one cycle. FIG. 9A(A) shows an observation image where the left side as seen in the figure is dark while the right side is bright. FIG. 9A(B) shows an observation image where the upper left side as seen in the figure is dark while the lower right side is bright. FIG. 9A(C) shows an observation image where the upper side as seen in the figure is dark while the lower side is bright. FIG. 9A(D) shows an observation image where the upper right side as seen in the figure is dark while the lower left side is bright. FIG. 9A(E) shows an observation image where the right side as seen in the figure is dark while the left side is bright. FIG. 9A(F) shows an observation image where the lower left side as seen in the figure is dark while the upper right side is bright. FIG. 9A(G) shows an observation image where the lower side as seen in the figure is dark while the upper side is bright. FIG. 9A(H) shows an observation image where the lower left side as seen in the figure is dark while the upper right side is bright. Attention is paid to image intensity at a particular region indicated at 50 in the observation image. In a case where the enhanced contrast changes cyclically in conjunction with the movement of the diffraction spot, the image contrast cyclically changes as illustrated by a graph of FIG. 9B. In the graph, the abscissa is the angle of the edge with respect to the diffraction spot while the ordinate is the image contrast. The characters (a) to (h) in FIG. 9B correspond to the images (A) to (H) in FIG. 9A, respectively.

In the graph of FIG. 9C, the abscissa is the frequency indicating a cycle of contrast change, while the ordinate is the intensity of image contrast component varying in conjunction with the contrast change cycle. An image obtained according to the embodiment is superimposition of amplitude contrast corresponding to the intensity change of the electron beam through the observation specimen 20 and enhanced contrast obtained based on phase change. The amplitude contrast corresponds to an intensity at zero frequency position in the graph of FIG. 9C because the amplitude contrast is not susceptible to the change in the blocking direction of the beam on the diffraction spot. On the other hand, the enhanced contrast cyclically changes in conjunction with the cyclic change in the blocking direction of the beam, thence corresponding to the intensity of frequency (f) component corresponding to the cycle. In this manner, only the enhanced contrast component can be selectively extracted by converting an image intensity to a frequency space, followed by extracting only a component having a cycle. While the embodiment illustrates the example where the contrast in the image sinusoidally changes, the change in image intensity in one cycle can assume a variety of forms because the image contrast actually contains a variety of components. However, cyclic nature exists in such a case. Hence, the same method can be used for extracting only a cyclically changing component. It goes without saying that not only the frequency (f) component corresponding to the cycle but also a harmonic component occurring as a component having a frequency of an integral multiple thereof must be handled.

Figure 10:
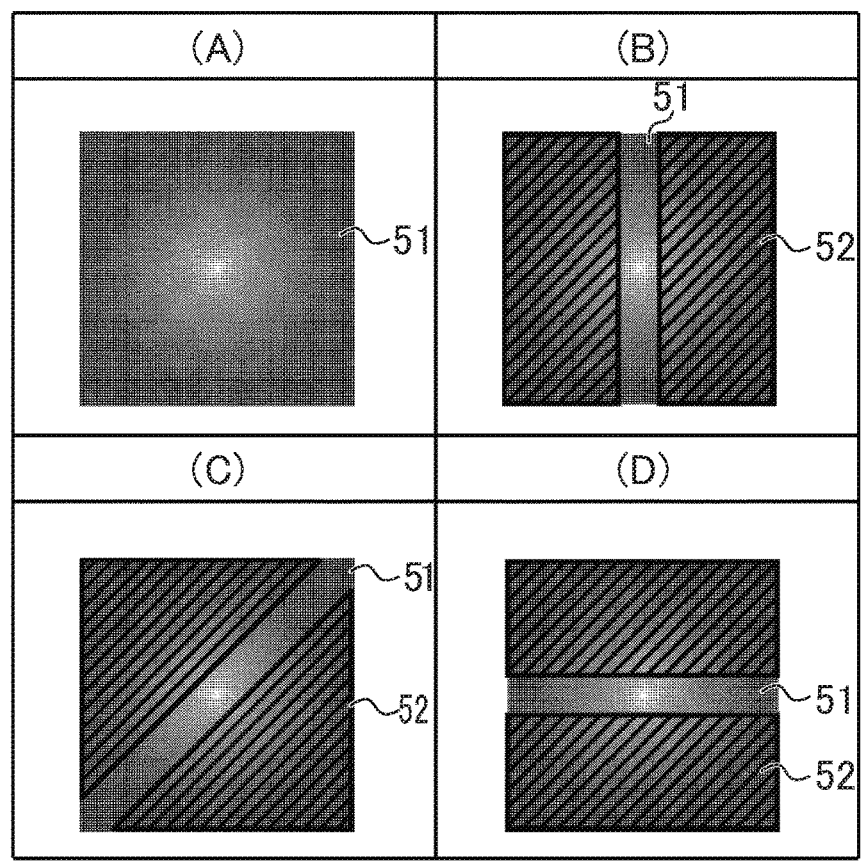
FIG. 10 is a set of images obtained under different conditions of blocking the diffracted wave, respectively showing a region containing an enhanced contrast component of the frequency condition of the observation image.

FIG. 10 is a set of images obtained under different conditions of blocking the diffracted wave, respectively showing a region containing an enhanced contrast component of the frequency condition of the observation image.

FIG. 10(A) shows an example of frequency information contained in a normal bright field image. A region indicated at 51 is a spatial frequency region containing information of the bright field image. In a case where the diffraction spot 2 is aligned with the aperture 37 of the edge element 38 at the position 40 shown in FIG. 4A under such an observation condition, about a half of the diffracted wave is blocked and hence, information contained in the corresponding spatial frequency region includes information of the enhanced contrast. By way of example of such a spatial frequency region, a region indicated at 52 in an image of FIG. 10(B) is a spatial frequency region containing the information of enhanced contrast. On the other hand, the region indicated at 51 in the image of FIG. 10(B) is a spatial frequency region containing information equivalent to the bright field image because all the conjugate diffracted waves are image-focused without being blocked. In a case where the diffraction spot is aligned on a position indicated at 41 shown in FIG. 4A, a region indicated at 52 in an image of FIG. 10(C) is a spatial frequency region containing the enhanced contrast information. In a case where the diffraction spot is aligned on a position indicated at 42 shown in FIG. 4A, a region indicated at 52 in an image of FIG. 10(D) is a spatial frequency region containing the enhanced contrast information. In the frequency space, as just described, the region containing the enhanced contrast information can be distinguished based on an optical condition. Hence, information equivalent to the enhanced contrast can be selectively acquired by making comparison based a difference from a normal bright field image or a frequency region equivalent to the bright field image.

Figure 11A:
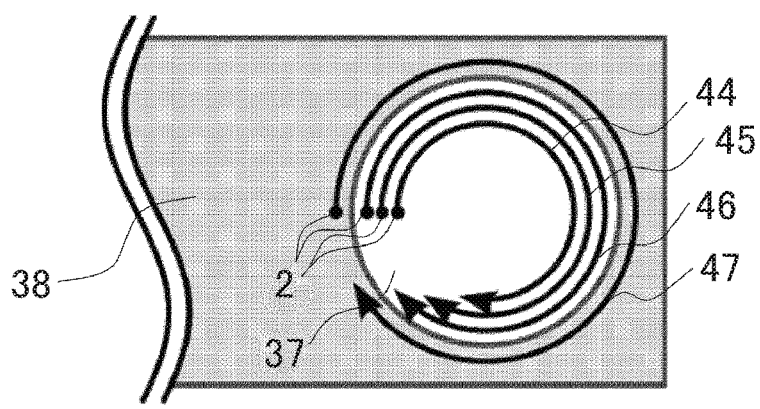
FIG. 11A is a diagram showing trajectories described by the diffraction spot under different conditions.
Figure 11B:
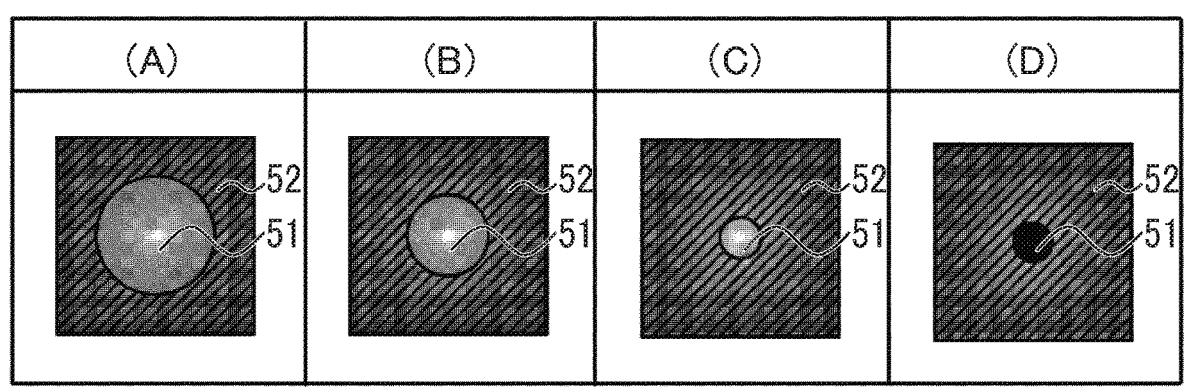
FIG. 11B is a set of images obtained under different conditions, respectively showing a region including an enhanced contrast component out of the spatial frequency components of the observation image.

FIG. 11A is a diagram showing trajectories described by the diffraction spot under different conditions. FIG. 11B is a set of images obtained under different conditions of FIG. 11A, respectively showing a region including an enhanced contrast component out of the spatial frequency components of the observation image. In this example, the aperture 37 has a circular shape so that the trajectory of the diffraction spot 2 moving along the edge thereof is inevitably in a circular shape. If the radius of this circular trajectory changes, an information component of the enhanced contrast contained in the resultant image changes.

In a case where the diffraction spot 2 describes the trajectory 44 shown in FIG. 11A, an image obtained by integration or addition of all the images acquired in the process has spatial frequency information as shown in FIG. 11B(A). The diffracted wave is not blocked in a spatial frequency region equivalent to a distance from the diffraction spot 2 to the edge. Hence, information of the relevant spatial frequency region is equivalent to that of the bright field image, thus corresponding to a region indicated at 51 in an image of FIG. 11B(A) A region of a higher spatial frequency, namely a spatial frequency region where one of the conjugate diffracted electron beams is blocked contains an information component of the enhanced contrast. The region corresponds to a region indicated at 52 in the image of FIG. 11B(A)

On the other hand, in a case where the diffraction spot 2 describes a trajectory 45 or a trajectory 46 as shown in FIG. 11A, diffracted wave on the lower angle side is also blocked. Hence, the spatial frequency information pieces of images acquired under such conditions go so far as to include enhanced contrast information components of lower spatial frequency regions, as shown in FIG. 11B(B) and FIG. 11B(C). As seen from the above, a direct relation is established between the positional relation between the diffraction spot 2 and the edge and the spatial frequency band providing the enhanced contrast in the observation image. Taking advantage of this, the information of enhanced contrast can be extracted from a plurality of acquired images and synthesized based on information on the condition of capturing the images. The way how the enhanced contrast appears varies depending upon the structure, phase change quantity and spatial differential value of the observation specimen. Therefore, the optimum optical condition varies depending upon the observation specimen and the field. However, images respectively having an optimum image contrast with respect to various fields and structures on the observation specimen can be obtained by using the above method.

In a case where the diffraction spot 2 describes a trajectory 47, a zero-dimensional diffraction spot formed by the direct beam is blocked by the edge element 38. Hence, an image is formed by the diffracted wave alone and spatial frequency information contained in the resultant observation image is that shown in FIG. 11B(D). In fact, a diffraction spot formed by the direct beam has a certain size. Hence, the enhanced contrast can appear even when a large part of the diffraction spot 2 is blocked. In a case where the radius of the trajectory 47 of the diffraction spot 2 is sufficiently large relative to the aperture 37, the imaging is performed using only the intensity of the diffracted wave. Such an imaging condition is close to annular dark field imaging. A method using a so-called hollow-cone illumination where the angle of an illumination beam on the observation specimen 20 is changed for shifting the diffraction spot 2 under such an imaging condition is generally called hollow cone illumination dark field imaging. In this case, the enhanced contrast does not appear basically because there is no interference between the direct beam and the diffracted wave.

Figure 12A:
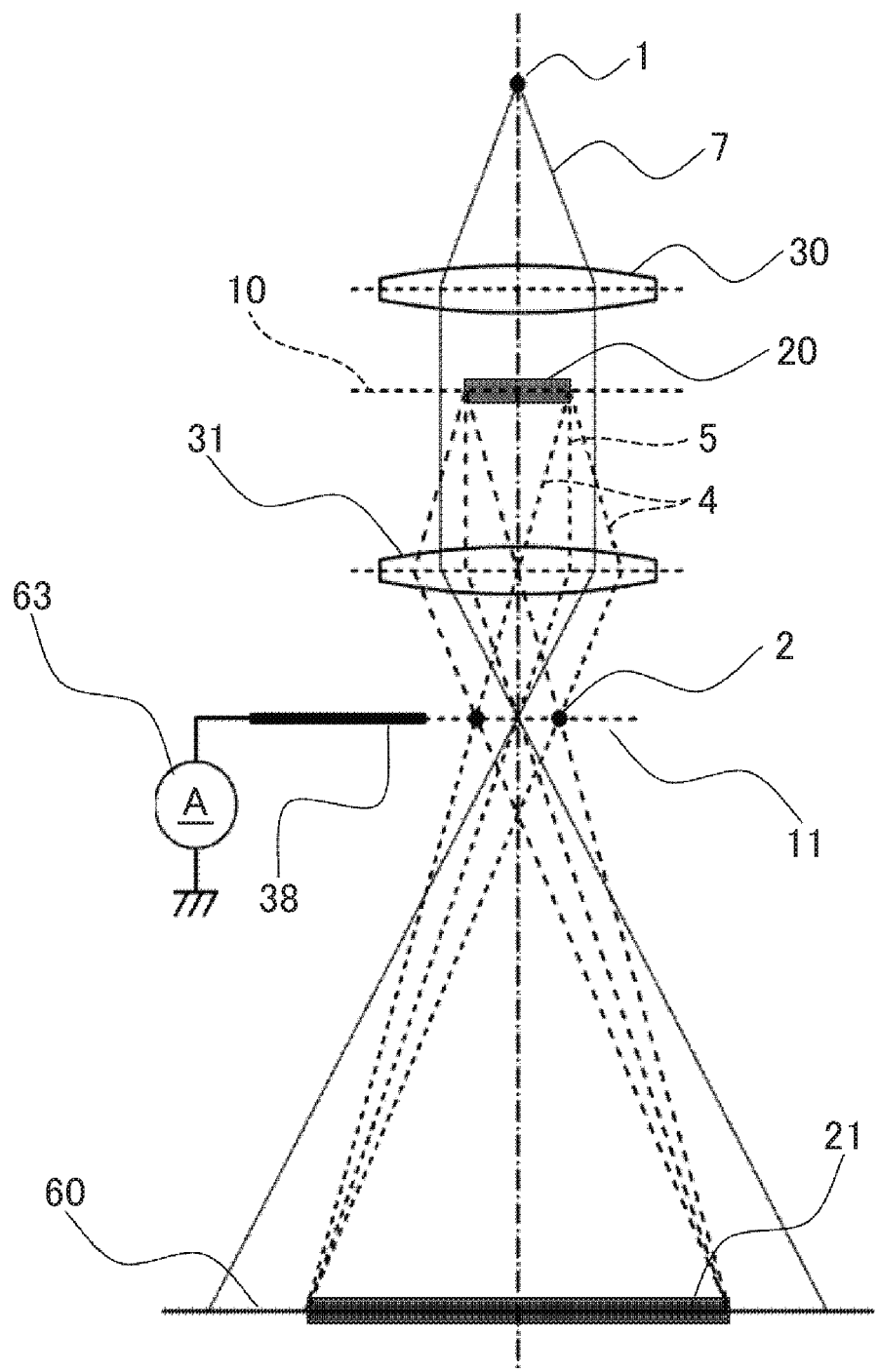
FIG. 12A is a diagram showing an exemplary configuration of an instrument capable of measuring a quantity of electron blocked by the edge element.

Next, adjustment of the condition of blocking the diffracted wave (alignment between the aperture center of the edge element 38 and the center of the trajectory described by the diffraction spot) is described with reference to FIG. 12A to FIG. 12G. FIG. 12A is a diagram showing an exemplary configuration of an instrument capable of measuring a quantity of electron blocked by the edge element. FIG. 12A omits the imaging system lens 35 to enhance the clarity of the drawing. FIG. 12A illustrates an ammeter 63 connected to the edge element 38 so as to measure the quantity of electron blocked by the edge element 38.

Figure 12B:
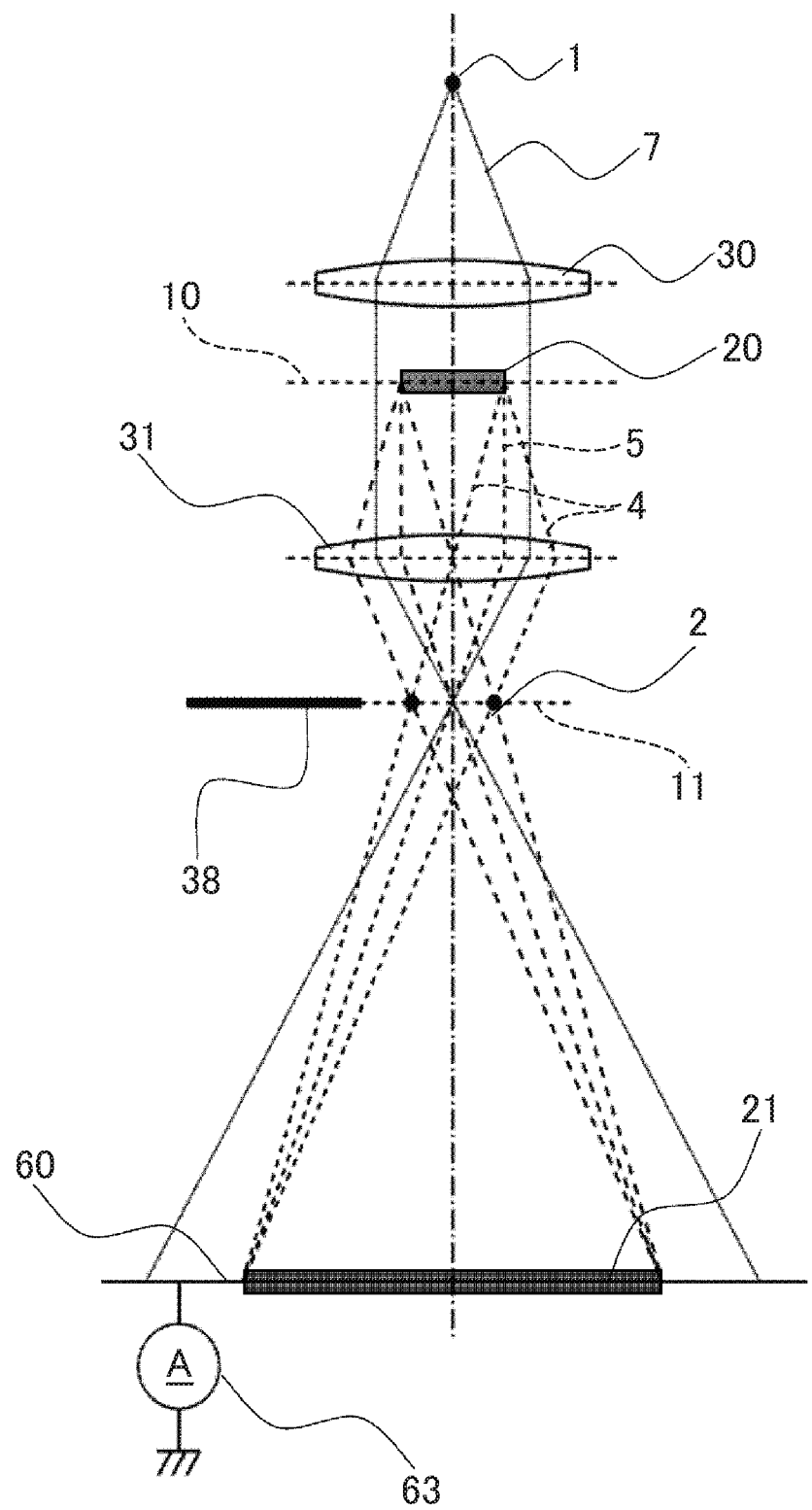
FIG. 12B is a diagram showing a first exemplary configuration of an instrument capable of measuring a quantity of electron not blocked by the edge element.
Figure 12C:
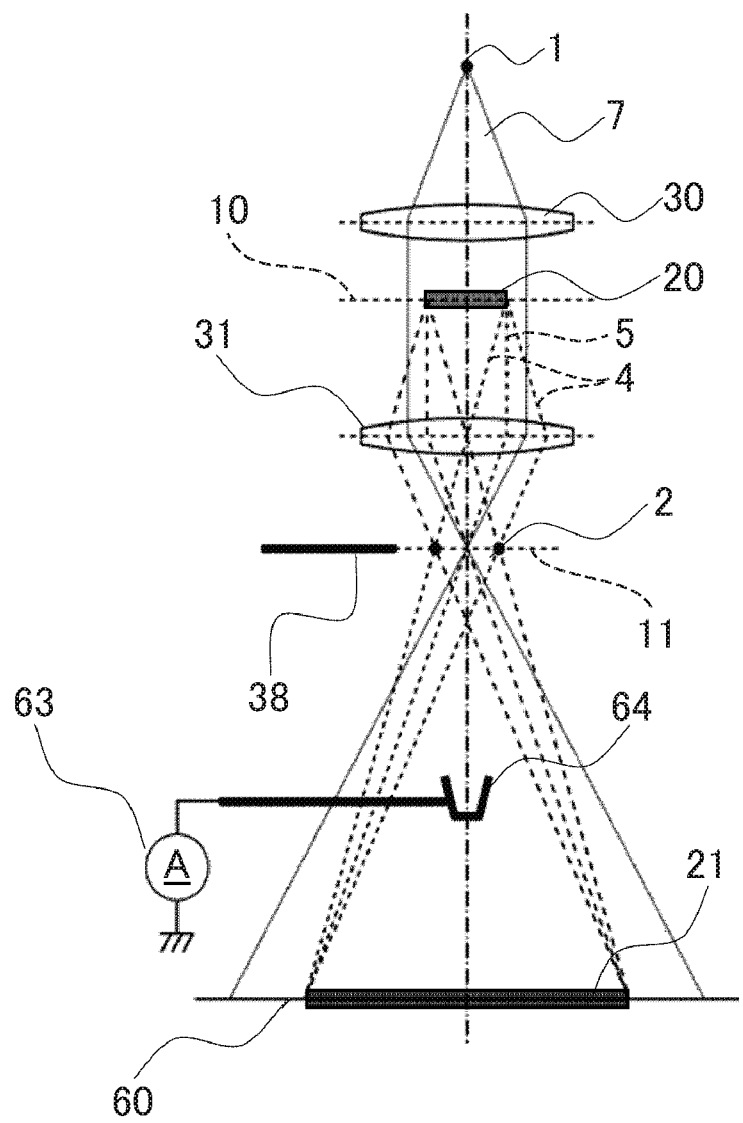
FIG. 12C is a diagram showing a second exemplary configuration of an instrument capable of measuring a quantity of electron not blocked by the edge element.
Figure 12D:
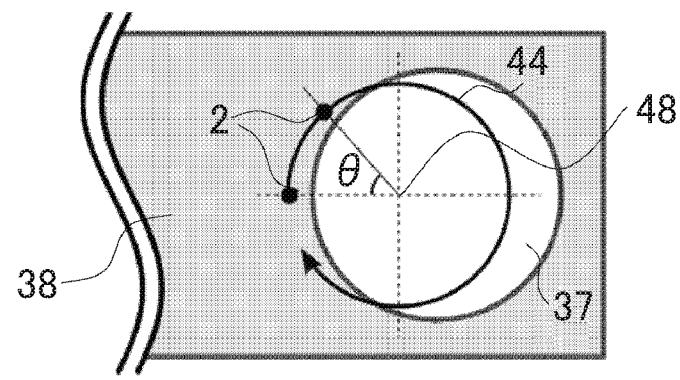
FIG. 12D is a plan view showing an edge element disposed on the diffraction plane and a trajectory described by the diffraction spot formed thereon.
Figure 12E:
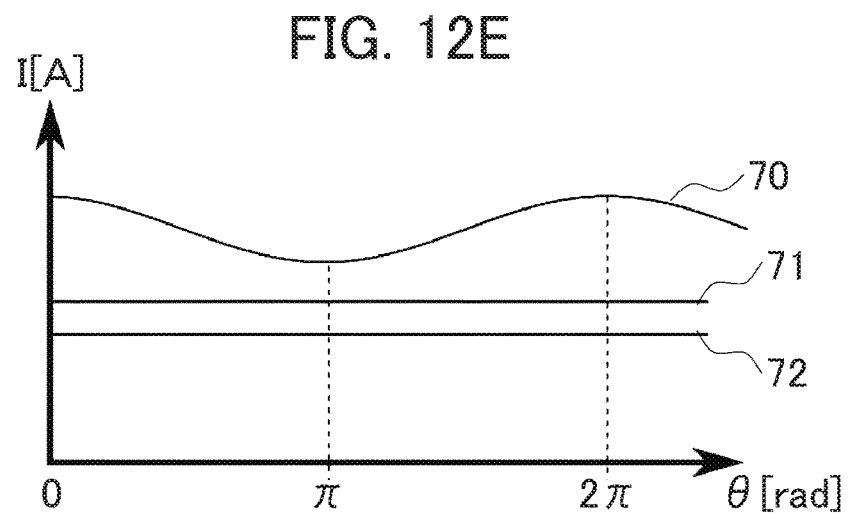
FIG. 12E is a graph showing the dependency of the quantity of electron blocked by the edge element on the azimuth angle of the diffraction spot.

FIG. 12D is a plan view showing an edge element disposed on the diffraction plane and a trajectory described by the diffraction spot formed thereon. FIG. 12E is a graph showing the dependency of the quantity of electron blocked by the edge element on the azimuth angle of the diffraction spot. In order to isotopically achieve the contrast enhancing effect of the embodiment, a center 48 of the trajectory described by the diffraction spot 2 must be aligned with the center of the aperture 37. In a case where these centers are misaligned, namely where the diffraction spot 2 describes the trajectory 44 as shown in FIG. 12D, the quantity of electron blocked by the edge element 38 (current (I: ampere) through the ammeter 63) varies according to θ (radian) as indicated by a curve 70 shown in FIG. 12E where θ denotes the azimuth angle of the diffraction spot 2 with respect to the center 48, provided that low-angle diffraction component of the diffraction spot is substantially considered to have a rotationally symmetric distribution of intensity. The current value variation curve 70 indicates that the trajectory described by the diffraction spot is misaligned with the edge.

The center 48 can be aligned with the center of the aperture 37 by making adjustment such that a constant quantity of electron is blocked by the edge element 38 irrespective of θ, namely the current through the ammeter 63 is indicated by a linear line 71 in FIG. 12E. The current value variation line 71 indicates that the trajectory described by the diffraction spot is aligned with the edge. In a case where the radius of the trajectory 44 is further reduced, the quantity of electron blocked by the edge element 38 is further reduced. Thus, the quantity of blocked electron assumes a further lower current value as indicated by a line 72 in FIG. 12E. The current value variation line 72 indicates that the trajectory described by the diffraction spot is aligned with the edge but is spaced from the edge. The use of the deflector facilitates changing the radius of the trajectory 44 with the center thereof fixed in position. Therefore, alignment with even higher accuracy can be achieved by evaluating the quantity of blocked current while changing the radius of the trajectory in this manner.

Figure 12F:
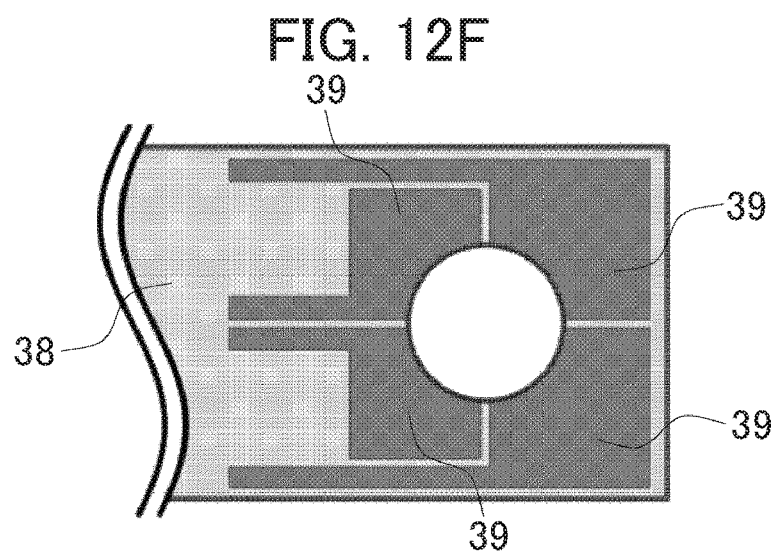
FIG. 12F is a plan view showing an example where the edge element is divided into plural electrodes.
Figure 12G:
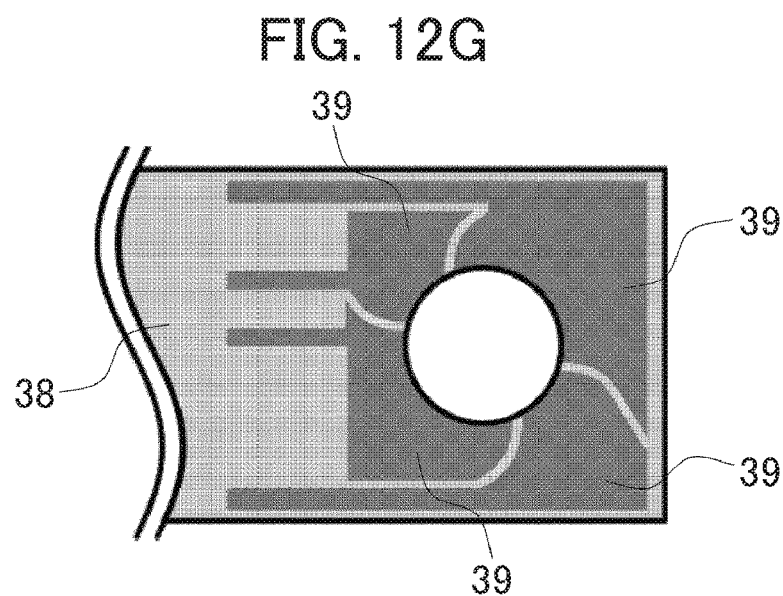
FIG. 12G is a plan view showing an example where the edge element is divided into plural electrodes.

FIG. 12F and FIG. 12G are plan views each showing an example where the edge element is divided into plural electrodes. By measuring a value of the current through each of the divided electrodes 39 in conjunction with the movement of the diffraction spot, the center position and distortion of the trajectory of the diffraction spot with respect to the aperture can be adjusted with high accuracies. The number of divisions of the electrode 39 is not limited to four as shown in the figure. As a matter of course, individual electrodes 39 may be cut off in a pattern other than linear pattern or may not be configured to equally divide the edge.

FIG. 12B is a diagram showing a first exemplary configuration of an instrument capable of measuring a quantity of electron not blocked by the edge element. FIG. 12C is a diagram showing a second exemplary configuration of an instrument capable of measuring a quantity of electron not blocked by the edge element. FIG. 12B and FIG. 12C omit the imaging system lens 35 to enhance the clarity of the drawing. The instrument of FIG. 12B is equipped with the ammeter 63 for measuring a quantity of electron not blocked by the edge element 38 and image-focused on the fluorescent plate 60. If loss of electron and the like does not occur in the imaging process, the sum of a quantity of electron blocked by the edge element 38 and a quantity of electron not blocked and image-focused is constant. Hence, the adjustment as described with reference to FIG. 12A can also be made by using the quantity of electron incident on the fluorescent plate 60.

The measurement of the quantity of electron not blocked can also be taken by using means other than the fluorescent plate 60, such as a Faraday up 64 for receiving the electron beam as shown in FIG. 12C, or a throttle plate equipped with an additional device.

Figure 13:
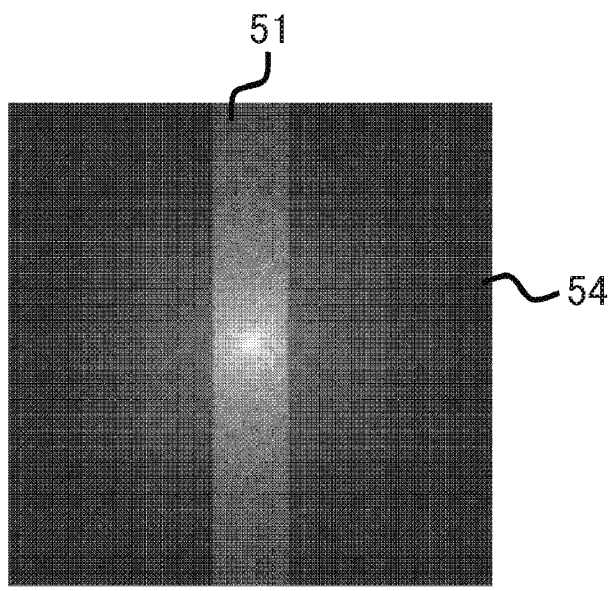
FIG. 13 is an image showing a distribution of spatial frequency information obtained by Fourier transforming an image recorded with a part of the diffracted wave blocked by the edge element.

Next, an adjustment of condition of blocking the diffracted wave (position of the diffraction spot) is described with reference to FIG. 13. FIG. 13 is an image showing a distribution of spatial frequency information obtained by Fourier transforming an image recorded with a part of the diffracted wave blocked by the edge element. In a case where a part of the diffracted wave is blocked by the edge element 38, the influence appears in the form of a shadow 54 in the spatial frequency information of the observation image as shown in FIG. 13. An indirect measurement of a distance between the edge and the diffraction spot can be taken by measuring a distance from the center of the spatial frequency information to this shadow 54. Thus, the position of the diffraction spot can be adjusted based on this measurement result.

In the case of observation of the diffraction pattern as well, the influence of wave blocking by means of the aperture can be similarly observed as a shadow. This approach also provides the adjustment of the position of the diffraction spot.

Figure 14:
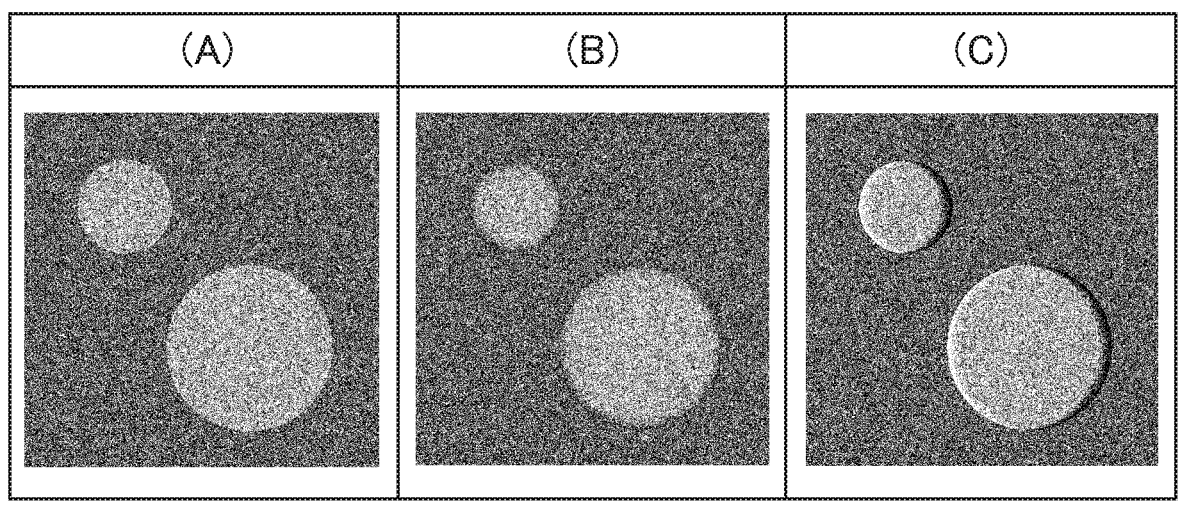
FIG. 14 is a set of exemplary images acquired when the position of the diffraction spot is adjusted based on contrast symmetry of the observation image.

Next, an adjustment of the blocking condition of the diffracted wave (the position of the diffraction spot based on the contrast symmetry of the observation image) is described with reference to FIG. 14. FIG. 14 is a set of exemplary images acquired when the position of the diffraction spot is adjusted based on the contrast symmetry of the observation image.

FIG. 14(A) shows an exemplary image obtained by normal bright field imaging of an observation specimen formed with a hole. In a case where the observation specimen is in focus, a contrast enhancing an edge of the hole in the observation specimen does not appear.

FIG. 14(B) shows an exemplary image of a similar observation specimen obtained by integration of enhanced contrasts appearing in different directions of the image. In a case where the optical system is so adjusted as to provide an isotropic blocking condition, an isotropic contrast appears on the edge of the hole.

FIG. 14(C) shows an exemplary image obtained when a trajectory described by the diffraction spot is not aligned with the center of the aperture 37 of the edge element 38. In this case, the blocking condition is laterally asymmetric as seen in the image. Hence, bright-dark contrast on the right-and-left side edge of the hole appears the opposite way. Depending upon the structure or system of the observation specimen, as just described, the anisotropy of contrast formed in the observation image can be grasped from the observation image. Hence, the blocking condition of the diffracted wave can be adjusted based on such information.

Assuming that the aperture 37 has a circular shape, for example, a part of the aperture acts approximately like a knife edge for blocking a half of the diffraction plane so that about a half of the diffracted wave is blocked, except for a case where the aperture 37 is extremely small as compared with the size of the diffraction plane. As a result, the enhanced contrast appears. In a case where a direct beam spot on the diffraction plane is shifted along the edge of the aperture 37 in this state, a direction of the enhanced contrast appearing on the image continuously changes. In the case of the use of the circular aperture 37, the diffraction spot thus shifted describes a circular trajectory in the diffraction plane.

In a case where any one of diffraction planes formed in the optical system is not aligned with the edge in height, the imaging according to the embodiment achieves a lower contrast enhancing effect than that of imaging under a realistic condition. However, the enhanced contrast per se does appear so that the effect of the embodiment can be achieved sufficiently.

If the virtual source above the observation specimen 20 is changed in height when a region of electron beam illumination on the observation specimen 20 is controlled, the height of the diffraction plane formed at place downstream from the observation specimen is also changed. In the imaging according to the embodiment, it is desirable to provide a control to obviate such a height change. A method of using a plurality of illumination system lenses for aligning the illumination region of electron beam is effectively adopted as one of countermeasures against the problem.

If the observation specimen 20 is out of focus during the imaging according to the embodiment when the angle of the electron beam illuminated on the observation specimen 20 is controlled for positional control of the diffraction spot, the observation image is shifted in conjunction with the change in the beam illumination angle. In this connection, the convenience of imaging can be enhanced by using a method of aligning the focus based on the quantity of image displacement, a method of using a deflector for shifting the image to cancel the image displacement, or a method of correcting for the image displacement before recording the image.

It is basically favorable to form the edge element 38 of a metal. However, if some foreign substance adheres to the surface of the edge element 38, electric charge may be accumulated in the foreign substance to cause deflection or phase modulation of the electron beam. Such a problem brings about a noticeable influence particularly when the electron beam is stopped at one place on the edge element 38. In contrast, the embodiment is configured to shift the diffraction spot on the diffraction plane so that the quantity of electric charge accumulated at one place on the edge is less than that when the diffraction spot is stopped. As a result, the embodiment can achieve an effect to reduce the unwanted action of causing the deflection or phase modulation of the electron beam.

In a case where the diffraction spot is shifted on a higher cycle, the current through the deflector used for controlling the diffraction spot changes at a higher frequency. This may sometimes result in decrease in response speed due to the inductance of coil constituting the deflector, or properties of a magnetic material around the deflector. Particularly, the following problem may be induced if the electron beam is controlled by the use of a combination of plural coils. The above decrease in response speed varies from one deflector to another. As a result, an adjusted relation among the plural deflectors breaks down so that when only the illumination angle of the electron beam on the observation specimen is to be changed, the illumination position on the observation specimen is also changed. In this case, an effective method can be used in which the phase adjustment of a control current applied to the deflector or the amperage change of the deflector associated with beam control is changed according to the control frequency.

It is desirable that the edge element 38 used in the embodiment has a thickness in the range of several to several hundred nanometers. In a case where the edge element has a greater thickness than the above, this state is not compliant with a condition for idealistic enhanced contrast because the thickness of the edge is greater relative to a thickness of the diffraction plane defined by focus broadening and the like of the optical system. However, the effect to enhance contrast can be achieved.

Figure 15:
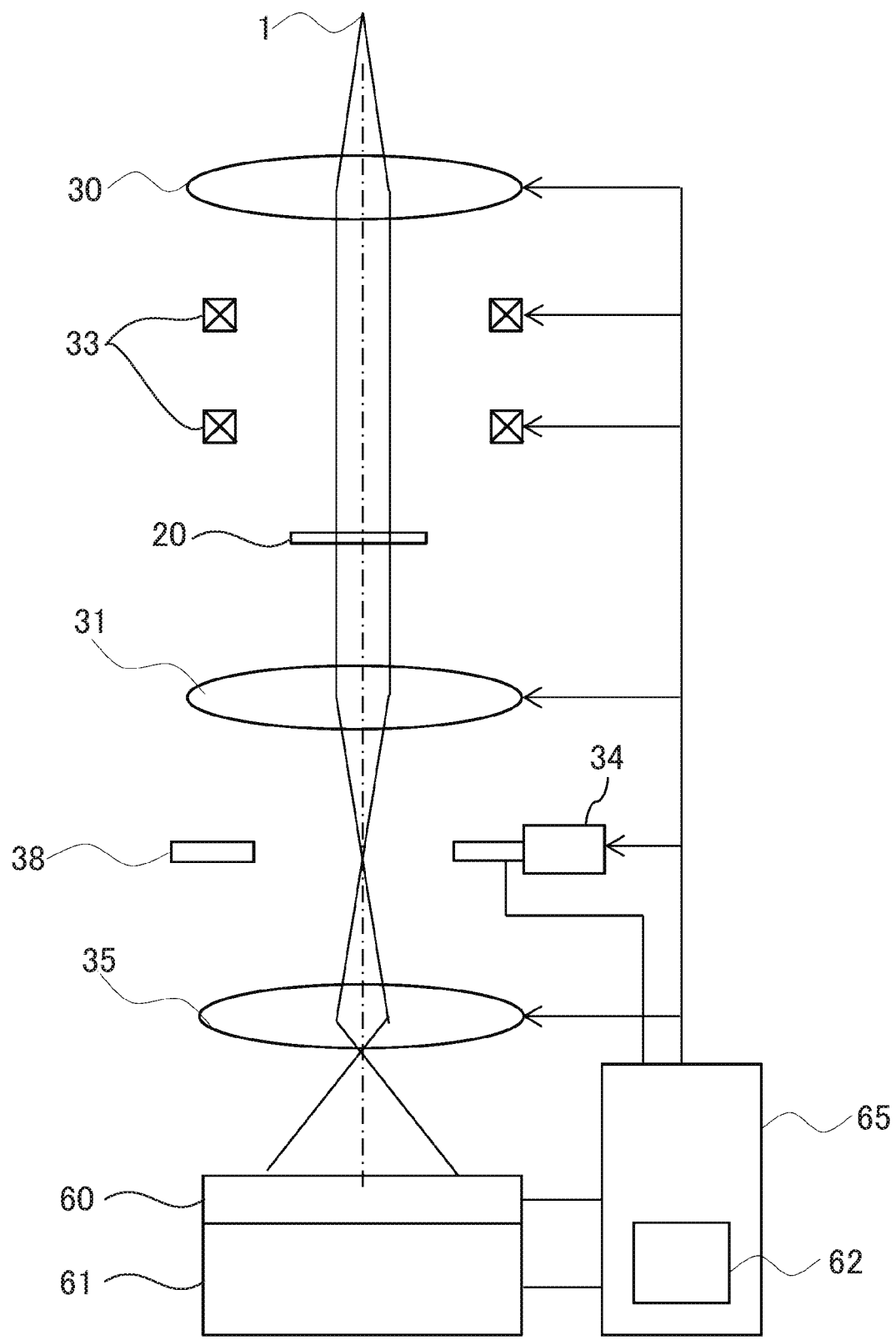
FIG. 15 is a diagram showing a configuration of TEM according to the embodiment.

Next, a configuration of the TEM according to the embodiment is described with reference to FIG. 15. FIG. 15 is a diagram showing a configuration of the TEM according to the embodiment. Although FIGS. 3A, 3B, 5A, 5B, 6, 7, 12A, 12B and 12C omit a part of the configuration to enhance the clarity of the drawings, FIG. 15 contains some components of FIGS. 3A, 5A, 7, 12A and 12B.

The TEM according to the embodiment includes at places above the observation specimen 20: the virtual source 1; the illumination system lens 30 allowing the passage of the electron beam 7 spread from the virtual source 1; and the upper and lower deflectors 33 for inclining the electron beam 7. Incidentally, the drawing shows a case where the electron beam 7 is not inclined. The transmission electron microscope further includes at places under the observation specimen 20: the objective lens 31 for converging the electron beam 7 (diffracted wave and direct beam) transmitted through the observation specimen 20 and broadened; the edge element 38 disposed on the back focal plane (diffraction plane) 11 of the objective lens 31; the micromotion mechanism 34 for mechanically controlling the position of the edge element 38; the imaging system lens 35 for image-focusing the electron beam 7 (diffracted wave and direct beam) passing through the aperture 37 of the edge element 38 and spread; the fluorescent plate 60 where the electron beam through the imaging system lens 35 forms the observation image; and the imaging device 61 for recording the image projected on the fluorescent plate 60. Further, the TEM according to the embodiment includes: the arithmetic unit 62 for performing arithmetic processing of the recorded image; and a control unit 65 for controlling the lenses, the deflectors and the micromotion mechanism 63. The control unit 65 retrieves a value of the ammeter 63 connected to the edge element 38 and the fluorescent plate 60. The control unit 65 includes: a drive power circuit controlled by a CPU; a storage unit for storing software to be executed by the CPU; a keyboard and a mouse which permit input/output control by an operator; an interface of a display unit; and the like.

The virtual source is equivalent to a virtual electron beam spot or an actual electron beam spot formed by an electron gun including: an electron source; an electrostatic or electromagnetic extraction electrode; an electrostatic acceleration electrode and the like. The electron gun includes: a cold cathode field-emission electron gun adapted for field emission of electron beam without heating the electron source; and a Schottky-type electron gun adapted for emission of electron beam by heating the electron source.

Figure 16:
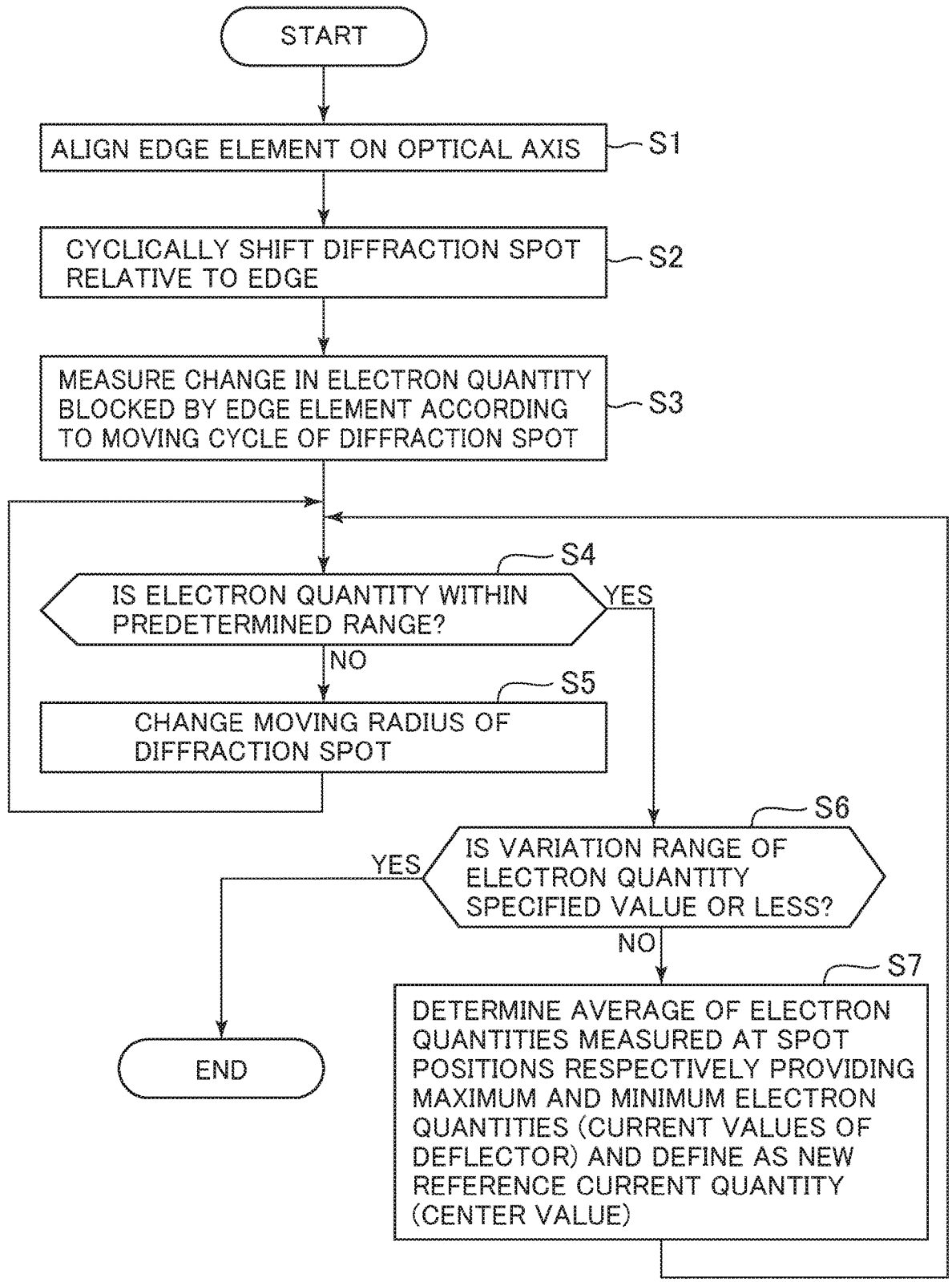
FIG. 16 is a flow chart showing the steps of an alignment method for the TEM according the embodiment.

Next, a TEM alignment method according to the embodiment is described with reference to FIG. 16. FIG. 16 is a flow chart showing the steps of an alignment method for the TEM according the embodiment.

Step S1: A control unit 65 aligns the aperture 37 of the edge element 38 on the optical axis.

Step S2: T control unit 65 cyclically shifts the diffraction spot with respect to an edge defining the aperture 37 of the edge element 38, as shown in FIG. 4B.

Step S3: The control unit 65 measures a change in the quantity of electron blocked by the edge element 38 according to the cycle of diffraction spot shift as shown in FIG. 12E by using the ammeter 63 connected to the edge element 38 as shown in FIG. 12A, for example. Otherwise, the control unit may measure the quantity of electron not blocked by the edge element 38, as shown in FIG. 12B and FIG. 12C.

Step S4: The control unit 65 determines whether or not the quantity of electron is within a predetermined range. If "Yes", the control unit proceeds to Step S6. If "No", the control unit proceeds to Step S5.

Step S5: The control unit 65 changes the moving radius of the diffraction spot and proceeds to Step S4.

Step S6: The control unit 65 determines whether or not the variation range of electron quantity is a specified value or less. The control unit 65 determines the electron quantity using the ammeter 63 connected to the edge element 38 as shown in FIG. 12A or FIG. 12B. The variation range of electron quantity is determined based on a difference between the maximum value and the minimum value of electron quantity, standard deviation, or the like. If "No", the control unit proceeds to Step S7.

Step S7: The control unit 65 determines an average of electron quantities measured at spot positions respectively providing the maximum and the minimum electron quantities and defines the resultant average value as a new reference value (center value).

The embodiment can achieve the isotropic image contrast.

The embodiment can also achieve a sufficient image contrast on an image of a soft material (specimen, such as biological specimen and organic material which is composed of a light element and has a weak interaction with the electron beam). This negates the need for a dyeing treatment normally performed in the imaging of these specimens. The dyeing treatment uses an element such as a metallic element having a strong interaction with electron. Therefore, even in the case of freeze-fracture microscopy which provides imaging of a biological specimen in a state closer to its usual state and to which the dyeing treatment is not applicable, the embodiment can provide a high-contrast imaging.

Furthermore, the embodiment negates the need for a method widely used for achieving high contrast by largely shifting the focus of the objective lens from the specimen. This method is based on a phenomenon that the influence of spherical aberration of the objective lens produces an optical path difference between the electron beam diffracted by the specimen and the direct beam not diffracted by but transmitted through the specimen, resulting in phase difference. This phase difference provides image contrast according to the phase change of the electron beam transmitted through the specimen. Since this method fundamentally utilizes the aberration of the objective lens, it is difficult to impart a phase difference to a wave diffracted at very low angles. As a result, it is difficult to achieve a contrast enhancement effect for a structure having a dimension not less than several nanometers. The embodiment does not adopt this method and hence, can achieve contrast enhancement even for the structure having a dimension not less than several nanometers.

While the invention accomplished by the inventors has been specifically described with reference to the embodiments thereof, the invention is not limited to the foregoing embodiments and as a matter of course, a variety of changes and modifications may be made thereto.

While the embodiment has been described by way of example of the transmission electron microscope, the invention is also applicable to scanning transmission microscope.

LIST OF REFERENCE SIGNS

1: virtual source
2: diffraction spot
3: diffraction spot
4: diffracted wave
5: non-diffracted wave
6: interference region between direct beam and diffracted wave
7: electron beam
9: inclinedly illuminated electron beam
10: specimen plane
11: diffraction plane (back focal plane)
12: image plane
20: observation specimen
21: observation image
22: observation image
23: observation image
30: illumination system lens
31: objective lens
32: knife edge
33: deflector
34: micromotion mechanism 35: imaging system lens
36: objective aperture
37: aperture
38: edge element
39: electrode
40: diffraction spot
41: diffraction spot
42: diffraction spot
43: diffraction spot
44: trajectory
45: trajectory
46: trajectory
47: trajectory
48: center of trajectory
50: particular region in observation image
51: spatial frequency region
52: spatial frequency region
53: spatial frequency region
54: shadow
60: fluorescent plate
61: imaging device
62: arithmetic unit
63: ammeter
64: Faraday cup
65: control unit
70: current value variation
71: current value variation
72: current value variation

The invention claimed is:

1. An electron microscope for observation by illuminating an electron beam on a specimen, comprising:
   an edge element disposed in a diffraction plane where a direct beam not diffracted by but transmitted through the specimen converges or a plane equivalent to the diffraction plane; and
   a control unit for controlling the electron beam or the edge element,
   wherein the edge element includes a blocking portion for blocking the electron beam, and an aperture for allowing the passage of the electron beam,
   the aperture is defined by an edge of the blocking portion in a manner that the edge surrounds a convergence point of the direct beam in the diffraction plane, and
   the control unit varies contrast of an observation image by shifting, relative to the edge, the convergence point of the direct beam along the edge while maintaining a predetermined distance between the convergence point of the direct beam and the edge.

2. The electron microscope according to claim 1, wherein the control unit acquires an observation image of the specimen by performing arithmetic processing on plural images obtained on different conditions of the relative position between the convergence point of the direct beam and the edge.

3. The electron microscope according to claim 1, wherein the control unit cyclically shifts the convergence point of the direct beam.

4. The electron microscope according to claim 1, wherein the control unit adjusts a positional relation between the convergence point of the direct beam and the edge based on a quantity of electron blocked by the edge element or a quantity of electron not blocked by the edge element.

5. The electron microscope according to claim 1, wherein the control unit adjusts a positional relation between the convergence point of the direct beam and the edge based on spatial frequency information contained in an observed image or on the observed image.

6. The electron microscope according to claim 1, wherein the control unit adjusts a positional relation between the convergence point of the direct beam and the edge based on contrast of an observed image.

7. The electron microscope according to claim 1, wherein the aperture is in a circular shape as seen in plan view, the edge element blocks about a half of the diffraction plane, and the control unit shifts the convergence point of the direct beam along the edge.

8. An imaging method for an electron microscopy for observation by illuminating an electron beam on a specimen, comprising the steps of:
   defining an edge for blocking the electron beam using an edge element including an aperture enclosing a convergence point of a direct beam in a diffraction plane disposed in a diffraction plane;
   converging the direct beam that is not diffracted by but is transmitted through the specimen on a plane equivalent to the diffraction plane; and
   varying a contrast of an observation image by shifting, relative to the edge element, the convergence point of the direct beam along the edge element while maintaining a constant distance between the convergence point of the direct beam and the edge element.

9. The imaging method according to claim 8, further comprising:
   acquiring an image of a specimen by performing arithmetic processing on plural images obtained on different conditions of a relative position between the convergence point of the direct beam and the edge element.

10. The imaging method according to claim 8, wherein the convergence point of the direct beam is cyclically shifted.

11. The imaging method according to claim 8, further comprising:
   adjusting a positional relation between the convergence point of the direct beam and the edge element based on a quantity of electron blocked by the edge element or on a quantity of electron not blocked by the edge element.

12. The imaging method according to claim 8, further comprising:
   adjusting a positional relation between the convergence point of the direct beam and the edge element based on spatial frequency information contained in an observed image or on the observed image.

13. The imaging method according to claim 8, further comprising:
   adjusting a positional relation between the convergence point of the direct beam and the edge element based on contrast of an observed image.

14. The imaging method according to claim 8, wherein the aperture is in a circular shape as seen in plan view, the edge element blocks about a half of the diffraction plane, and the convergence point of the direct beam is shifted along the edge element.

* * * * *